United States Patent
Lin et al.

(10) Patent No.: US 11,854,929 B2
(45) Date of Patent: Dec. 26, 2023

(54) SEMICONDUCTOR PACKAGE AND METHOD OF FORMING THE SAME

(71) Applicant: Taiwan Semiconductor Manufacturing Company, Ltd., Hsinchu (TW)

(72) Inventors: Yu-Sheng Lin, Hsinchu County (TW); Chin-Hua Wang, New Taipei (TW); Shu-Shen Yeh, Taoyuan (TW); Chien-Hung Chen, Hsinchu (TW); Po-Yao Lin, Hsinchu County (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 157 days.

(21) Appl. No.: 17/460,356

(22) Filed: Aug. 30, 2021

(65) Prior Publication Data

US 2023/0061968 A1 Mar. 2, 2023

(51) Int. Cl.
*H01L 23/48* (2006.01)
*H01L 21/00* (2006.01)
(Continued)

(52) U.S. Cl.
CPC ........ *H01L 23/3185* (2013.01); *H01L 21/563* (2013.01); *H01L 21/78* (2013.01);
(Continued)

(58) Field of Classification Search
CPC ............. H01L 23/3185; H01L 23/3192; H01L 23/49822; H01L 25/18; H01L 25/50; H01L 21/563; H01L 21/78
See application file for complete search history.

(56) References Cited

U.S. PATENT DOCUMENTS 8,772,929 B2 * 7/2014 Chen ...................... H01L 24/97
257/773
9,000,584 B2 4/2015 Lin et al.
(Continued)

FOREIGN PATENT DOCUMENTS

TW 201322391 6/2013

OTHER PUBLICATIONS

"Office Action of Taiwan Counterpart Application", dated Dec. 19, 2022, p. 1-p. 7.

Primary Examiner — Nicholas J Tobergte
(74) Attorney, Agent, or Firm — JCIPRNET

(57) ABSTRACT

An semiconductor package includes a redistribution structure, a first semiconductor device, a second semiconductor device, an underfill layer and an encapsulant. The first semiconductor device is disposed on and electrically connected with the redistribution structure, wherein the first semiconductor device has a first bottom surface, a first top surface and a first side surface connecting with the first bottom surface and the first top surface, the first side surface comprises a first sub-surface and a second sub-surface connected with each other, the first sub-surface is connected with the first bottom surface, and a first obtuse angle is between the first sub-surface and the second sub-surface. The second semiconductor device is disposed on and electrically connected with the redistribution structure, wherein the second semiconductor device has a second bottom surface, a second top surface and a second side surface connecting with the second bottom surface and the second top surface, the second side surface faces toward to the first side surface, the second side surface comprises a third sub-surface and a fourth sub-surface connected with each other, the third sub-surface is connected with the second bottom surface, and a second obtuse angle is between the third sub-surface and the fourth sub-surface. The underfill
(Continued)

layer is between the first semiconductor device and the second semiconductor device, between the first semiconductor device and the redistribution structure, and between the second semiconductor device and the redistribution structure. The encapsulant encapsulates the first semiconductor device, the second semiconductor device and the underfill layer.

20 Claims, 21 Drawing Sheets

(51) Int. Cl.
| | |
|---|---|
| *H01L 23/31* | (2006.01) |
| *H01L 21/56* | (2006.01) |
| *H01L 21/78* | (2006.01) |
| *H01L 23/498* | (2006.01) |
| *H01L 23/00* | (2006.01) |
| *H01L 25/18* | (2023.01) |
| *H01L 25/00* | (2006.01) |

(52) U.S. Cl.
CPC .... *H01L 23/3192* (2013.01); *H01L 23/49822* (2013.01); *H01L 24/16* (2013.01); *H01L 25/18* (2013.01); *H01L 25/50* (2013.01); *H01L 2224/16235* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,701,043 B2 * | 7/2017 | Fujita | B28D 1/121 |
| 2019/0164895 A1 * | 5/2019 | Kim | H01L 23/552 |
| 2022/0310501 A1 * | 9/2022 | Wang | H01L 23/49833 |
| 2023/0061968 A1 * | 3/2023 | Lin | H01L 23/49822 |

* cited by examiner

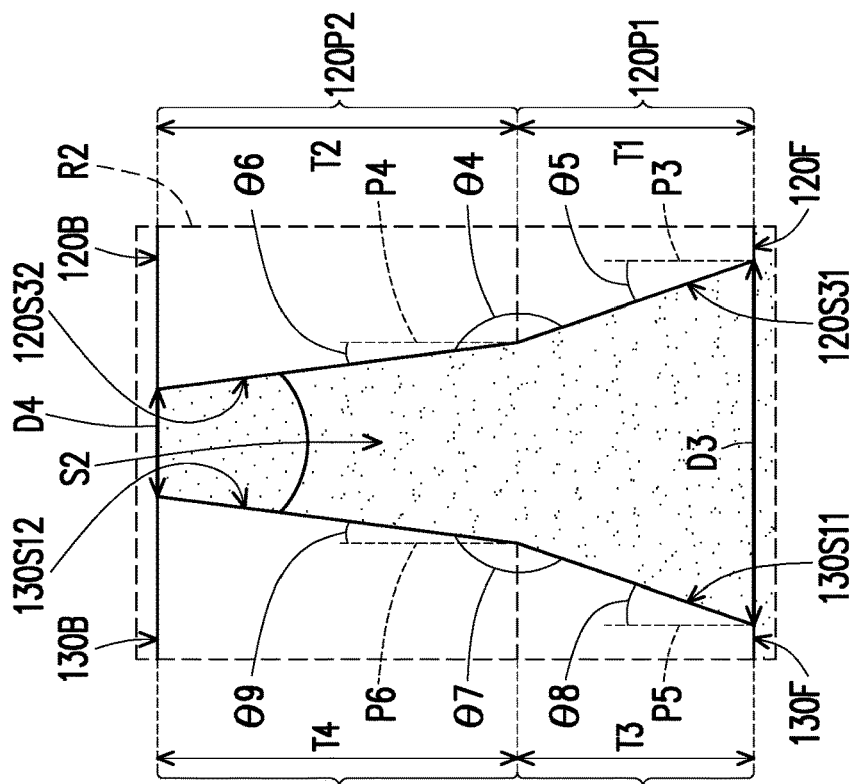
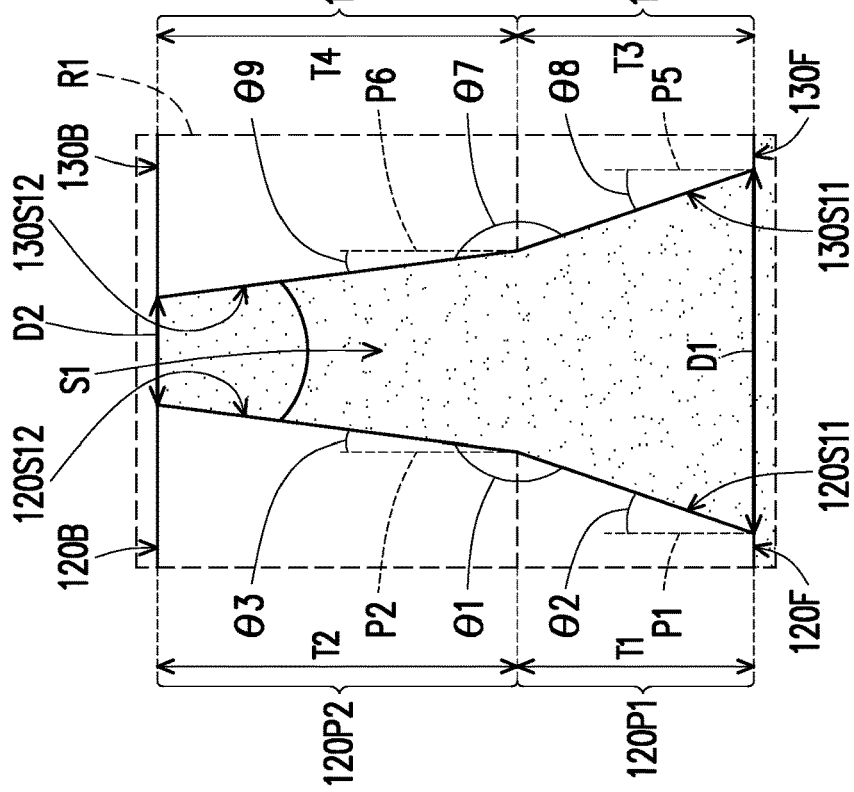
FIG. 2A
FIG. 2B

SEMICONDUCTOR PACKAGE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on. Currently, integrated fan-out packages are becoming increasingly popular for their compactness.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a schematic partial enlarge view of the dashed area R1 outlined in FIG. 1.

FIG. 2B is a schematic partial enlarge view of the dashed area R2 outlined in FIG. 1.

DETAILED DESCRIPTION

Figure 1:
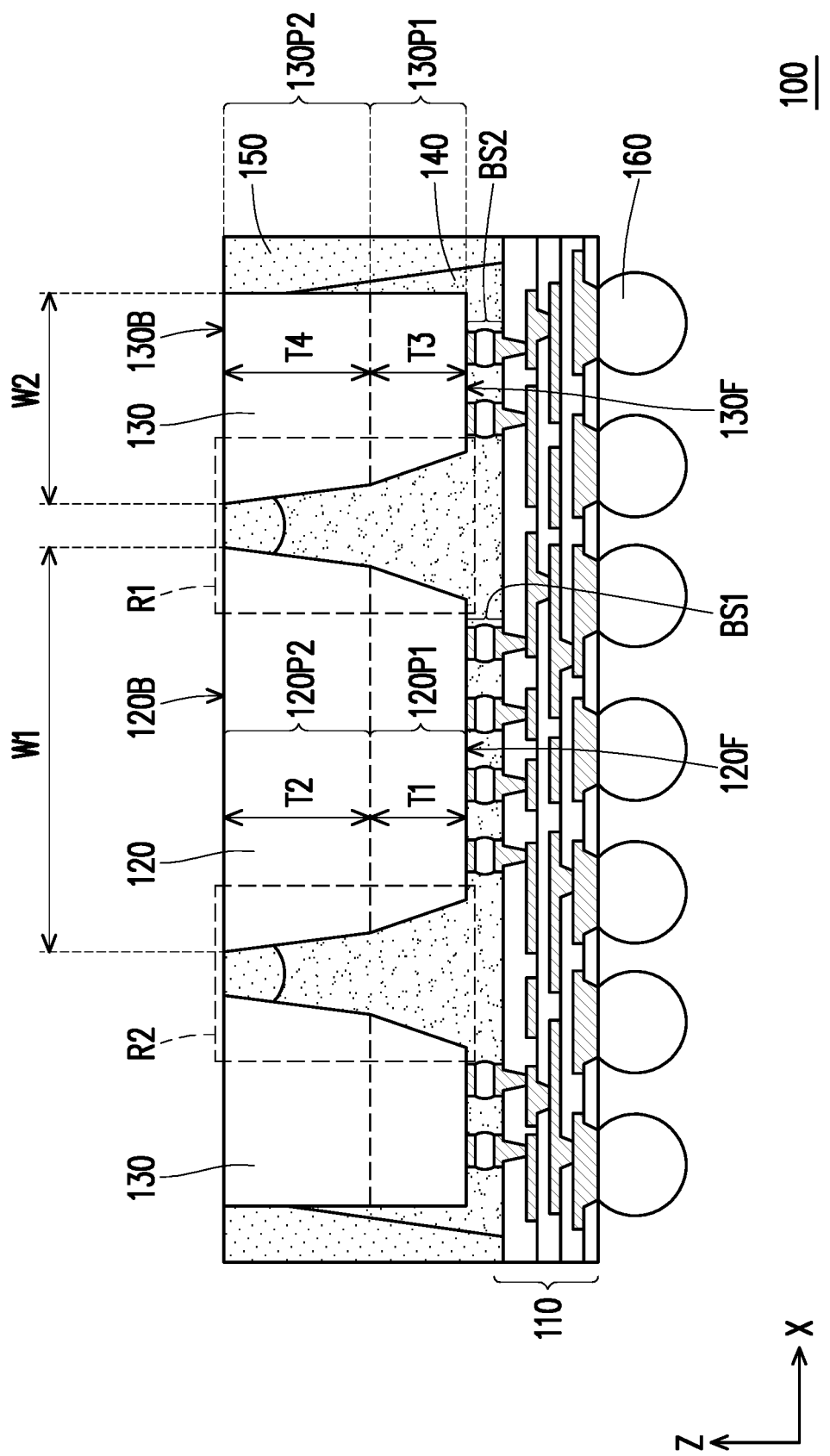
FIG. 1 is a schematic cross-sectional view of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 3:
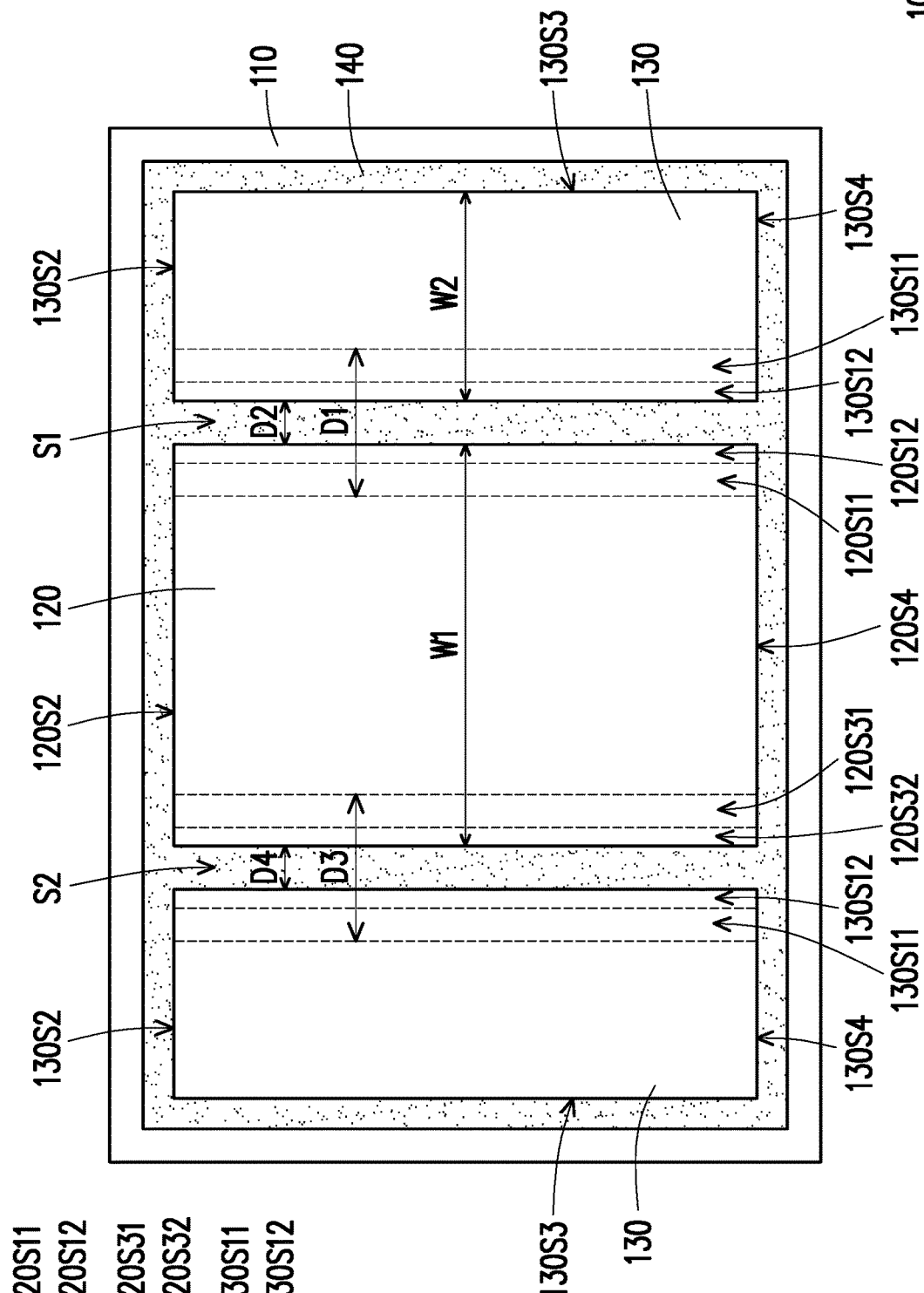
FIG. 3 is a simplified top view of a semiconductor package in accordance with some embodiments of the disclosure.

FIG. 1 is a schematic cross-sectional view of a semiconductor package 100 in accordance with some embodiments of the disclosure. FIG. 2A is a schematic partial enlarge view of the dashed area R1 outlined in FIG. 1. FIG. 2B is a schematic partial enlarge view of the dashed area R2 outlined in FIG. 1. FIG. 3 is a simplified top view of the semiconductor package 100 in accordance with some embodiments of the disclosure. For simplicity and clarity of illustration, some elements are omitted in the simplified top view of FIG. 3, and these elements might not be locates in the same plane. The semiconductor package 100 may be an integrated fan-out ("InFO") package.

Referring to FIG. 1, FIG. 2A, FIG. 2B and FIG. 3, the semiconductor package 100 includes a redistribution structure 110, a semiconductor device 120, a plurality of semiconductor devices 130, an underfill layer 140 and an encapsulant 150. In some embodiments, the semiconductor package 100 further includes a plurality of electrical terminals 160. The semiconductor device 120 is disposed on and electrically connected with the redistribution structure 110. As shown in FIG. 1, the semiconductor device 120 is electrically connected with the redistribution structure 110 through bonding structures BS1. The semiconductor devices 130 are disposed on and electrically connected with the redistribution structure 110. As shown in FIG. 1, the semiconductor devices 130 each are disposed aside the semiconductor device 120. In detail, as shown in FIG. 1, the side surface 130S1 of one of the semiconductor devices 130 faces toward the side surface 120S1 of the semiconductor device 120, the side surface 130S1 of another one of the semiconductor devices 130 faces toward the side surface 120S3 of the semiconductor device 120, and the side surface 120S1 is opposite to the side surface 120S3. That is to say, the semiconductor devices 130 are arranged at opposite sides of the semiconductor device 120. Further, as shown in FIG. 1, the semiconductor device 130 is electrically connected with the redistribution structure 110 through bonding structures BS2. The underfill layer 140 is located between the semiconductor device 120 and each semiconductor device 130, between the semiconductor device 120 and the redistribution structure 110, and between each semiconductor device 130 and the redistribution structure 110. As shown in FIG. 1, FIG. 2A, FIG. 2B and FIG. 3, the semiconductor device 120 is partially wrapped around by the underfill layer 140, and each semiconductor device 130 is partially wrapped around by the underfill layer 140. That is to say, the underfill layer 140 covers a portion of each of the side surfaces 120S1, 120S2, 120S3 and 120S4 of the semiconductor device 120, and a portion of each of the side surfaces 130S1, 130S2, 130S3 and 130S4 of each semiconductor device 130. Further, the underfill layer 140 surrounds each bonding structure BS1 and each bonding structure BS2. Owing to the underfill layer 140, a bonding strength between the semiconductor device 120 and the redistribution structure 110 and a bonding strength between each semiconductor device 130 and the redistribution structure 110 are enhanced, thereby improving the reliability of the semiconductor package 100. The encapsulant 150 encapsulates the semiconductor device 120, each semiconductor device 130 and the underfill layer 140. The electrical terminals 160 are disposed on the redistribution structure 110 opposite to the semiconductor device 120 and each semiconductor device 130. That is to say, the electrical terminals 160 are arranged at one side of the redistribution structure 110 opposite to another one side where the semiconductor device 120 and each semiconductor device 130 are disposed. Further, the electrical terminals 160 are electrically connected with the redistribution structure 110. That is to say, in embodiments, the electrical terminals 160 are electrically connected with the semiconductor device 120 and each semiconductor device 130 through the redistribution structure 110.

In some embodiments, each of the semiconductor device 120 and the semiconductor devices 130 is a logic die, a memory die, an application-specific integrated circuit ("ASIC") die, a sensor die, a wireless and radio frequency die, an analog die, a voltage regulator die, an integrated passive device (IPD) or any other suitable device. In some embodiments, the semiconductor device 120 is a system on chip (SoC), and the semiconductor devices 130 are high bandwidth memory (HBM) dies. In some embodiments, the semiconductor devices 130 have the same function and property (e.g., both are HBM dies). However, the disclosure is not limited thereto. In some alternative embodiments, the semiconductor devices 120 may have different functions and properties.

As shown in FIG. 1, FIG. 2A, FIG. 2B and FIG. 3, although two semiconductor devices 130 are presented around the semiconductor device 120 in the semiconductor package 100 for illustrative purposes, those skilled in the art can understand that the number of the semiconductor devices 130 may be more than or less than what is depicted in FIG. 1, FIG. 2A, FIG. 2B and FIG. 3, and may be designated based on demand and/or design layout. It is noted that when the semiconductor package 100 includes more than two semiconductor devices 130 around the semiconductor device 120, more than two side surfaces of the semiconductor device 120 may face toward the said semiconductor devices 130. Further, as shown in FIG. 1, although four bonding structures BS1 and two bonding structures BS2 are presented in the semiconductor package 100 for illustrative purposes, those skilled in the art can understand that the number of the bonding structures BS1 and the number of the bonding structures BS2 may be more than or less than what is depicted in FIG. 1, and may be designated based on demand and/or design layout.

As shown in FIG. 1 and FIG. 3, the width W1 of the semiconductor device 120 is greater than the width W2 of each semiconductor device 130. However, the disclosure is not limited thereto. In some alternative embodiments, the width W1 of the semiconductor device 120 may be equal to or less than the width W2 of each semiconductor device 130. Further, as shown in FIG. 1 and FIG. 3, the widths W2 of the semiconductor devices 130 are the same to each other. However, the disclosure is not limited thereto. In some alternative embodiments, the widths W2 of the semiconductor devices 130 are different from each other.

As shown in FIG. 1, FIG. 2A, FIG. 2B and FIG. 3, each of the side surfaces 120S1, 120S2, 120S3 and 120S4 of the semiconductor device 120 is connected with the front surface 120F (i.e., the illustrated bottom surface) and the back surface 120B (i.e., the illustrated top surface) of the semiconductor device 120. The side surface 120S1 of the semiconductor device 120 includes a sub-surface 120S11 and a sub-surface 120S12 connected with each other. In detail, as shown in FIG. 1, the sub-surface 120S11 is connected with the front surface 120F, and the sub-surface 120S12 is connected with the back surface 120B. That is to say, the side surface 120S1 of the semiconductor device 120 is constituted only by two sub-surfaces (i.e., sub-surface 120S11 and the sub-surface 120S12). However, the disclosure is not limited thereto. In some alternative embodiments, the side surface 120S1 of the semiconductor device 120 may be constituted by more than two sub-surfaces. From another point of view, the sub-surface 120S11 connected with the front surface 120F is nearer to the redistribution structure 110 than the sub-surface 120S12 connected with the back surface 120B.

In some embodiments, the sub-surface 120S11 and the sub-surface 120S12 form an obtuse angle. As shown in FIG. 2A, an included angle θ1 between the sub-surface 120S11 and the sub-surface 120S12 is an obtuse angle. In some embodiments, the included angle θ1 ranges from greater than 91° to less than 180°. In some embodiments, as shown in FIG. 2A, the sub-surface 120S11 and the sub-surface 120S12 are inclined side surfaces. In detail, an included angle θ2 is between the sub-surface 120S11 and a virtual plane P1 parallel with the direction Z perpendicular to the direction X and perpendicular to the back surface 120B, and an included angle θ3 is between the sub-surface 120S12 and a virtual plane P2 parallel with the direction Z. In some embodiments, as shown in FIG. 2A, the included angle θ2 between the sub-surface 120S11 and the virtual plane P1 is greater than the included angle θ3 between the sub-surface 120S12 and the virtual plane P2. That is to say, as shown in FIG. 2A, in the semiconductor device 120, the slope of the sub-surface 120S11 connected with the front surface 120F is less than the slope of the sub-surface 120S12 connected with the sub-surface 120S11. With such configuration, the uniformity of the flow filed of the underfill layer 140 during the formation process of the underfill layer 140 is improved.

The side surface 120S3 of the semiconductor device 120 includes a sub-surface 120S31 and a sub-surface 120S32 connected with each other. In detail, as shown in FIG. 2B, the sub-surface 120S31 is connected with the front surface 120F, and the sub-surface 120S32 is connected with the back surface 120B. That is to say, the side surface 120S3 of the semiconductor device 120 is constituted only by two sub-surfaces (i.e., sub-surface 120S31 and the sub-surface 120S32). However, the disclosure is not limited thereto. In some alternative embodiments, the side surface 120S3 of the semiconductor device 120 may be constituted by more than two sub-surfaces. From another point of view, the sub-surface 120S31 connected with the front surface 120F is nearer to the redistribution structure 110 than the sub-surface 120S32 connected with the back surface 120B.

In some embodiments, the sub-surface 120S31 and the sub-surface 120S32 form an obtuse angle. As shown in FIG. 2B, an included angle θ4 between the sub-surface 120S31 and the sub-surface 120S32 is an obtuse angle. In some embodiments, the included angle θ4 ranges from greater than 91° to less than 180°. In some embodiments, as shown in FIG. 2B, the sub-surface 120S31 and the sub-surface 120S32 are inclined side surfaces. In detail, an included angle θ5 is between the sub-surface 120S31 and a virtual plane P3 parallel with the direction Z, and an included angle θ6 is between the sub-surface 120S32 and a virtual plane P4 parallel with the direction Z. In some embodiments, as shown in FIG. 2B, the included angle θ5 between the sub-surface 120S31 and the virtual plane P3 is greater than the included angle θ6 between the sub-surface 120S32 and the virtual plane P4. That is to say, as shown in FIG. 2B, in the semiconductor device 120, the slope of the sub-surface 120S31 connected with the front surface 120F is less than the slope of the sub-surface 120S32 connected with the sub-surface 120S11. With such configuration, the uniformity of the flow filed of the underfill layer 140 during the formation process of the underfill layer 140 is improved.

Figure 8:
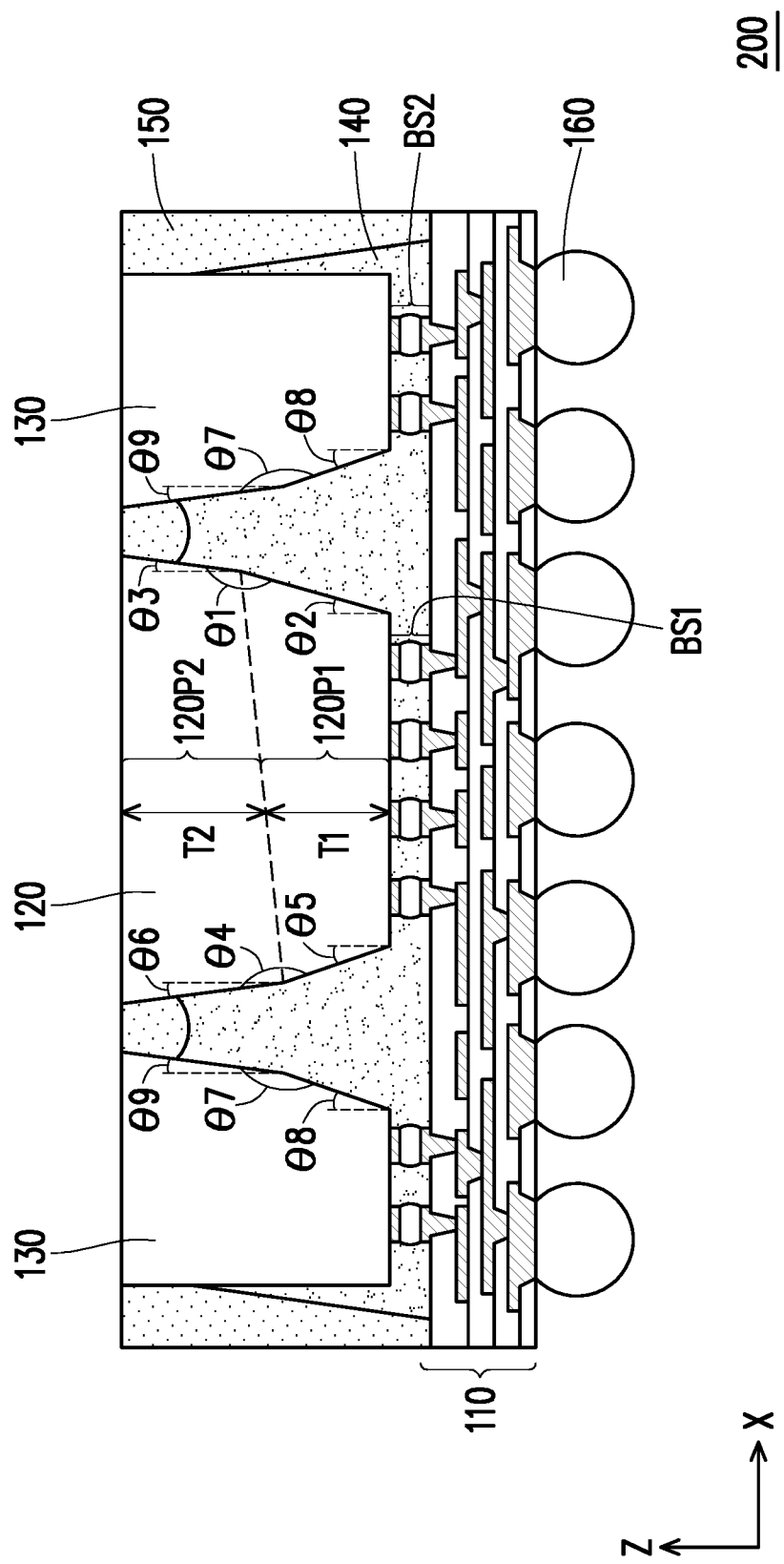
FIG. 8 is a schematic cross-sectional view of a semiconductor package in accordance with some alternative embodiments of the disclosure.

As shown in FIG. 1, FIG. 2A and FIG. 2B, the included angle θ4 of the side surface 120S3 is the same as the included angle θ1 of the side surface 120S1. However, the disclosure is not limited thereto. In some alternative embodiments, referring to FIG. 8, in the semiconductor package 200, the included angle θ4 of the side surface 120S3 is different from the included angle θ1 of the side surface 120S1. From another point of view, as shown in FIG. 1, the included angle θ2 is the same as the included angle θ5, and the included angle θ3 is the same as the included angle θ6. However, the disclosure is not limited thereto. In some alternative embodiments, the included angle θ2 is different from the included angle θ5, and/or the included angle θ3 is different from the included angle θ6. For example, as shown in the embodiment of FIG. 8, the included angle θ2 is different from the included angle θ5, while the included angle θ3 is the same as the included angle θ6.

In some embodiments, as shown in FIG. 1, FIG. 2A, FIG. 2B and FIG. 3, the side surfaces 120S2 and 120S4 of the semiconductor device 120 without facing toward any other semiconductor device are vertical side surfaces. That is to say, the side surfaces 120S2 and 120S4 extend substantially along the direction Z. In other words, an extending direction which each of the side surfaces 120S2 and 120S4 along with and the direction Z have an angular offset of less than 1°.

In some embodiments, as shown in FIG. 1, FIG. 2A and FIG. 2B, the semiconductor device 120 includes a portion 120P1 and a portion 120P2 stacking on the portion 120P1 along the direction Z. The portion 120P1 has the sub-surface 120S11 and the sub-surface 120S31, and the portion 120P2 has the sub-surface 120S12 and the sub-surface 120S32. That is to say, the portion 120P1 is nearer to the redistribution structure 110 than the portion 120P2. In some embodiments, as shown in FIG. 1, the bonding structures BS1 are in contact with the portion 120P1 of the first semiconductor device 120.

In some embodiments, as shown in FIG. 1, FIG. 2A and FIG. 2B, along the direction Z, the thickness T1 of the portion 120P1 is less than the thickness T2 of the portion 120P2. In such configuration of FIG. 1, FIG. 2A and FIG. 2B, each of the included angles θ2, θ3, θ5 and θ6 is less than 45 degree and greater than or equal to 1 degree. However, the disclosure is not limited thereto. In some alternative embodiments, along the direction Z, the thickness T1 of the portion 120P1 may be equal to or greater than the thickness T2 of the portion 120P2, and each of the included angles θ2, θ3, θ5 and θ6 is less than 30 degree and greater than or equal to 1 degree. With such configuration that each of the included angles θ2, θ3, θ5 and θ6 is less than 45 degree and greater than 0 degree or is less than 30 degree and greater than 0 degree, the circuit structure(s) and the electrical component(s) of the semiconductor device 120 are prevented from being damaged by the process for forming the sub-surfaces 120S11, 120S12, 120S31 and 120S32.

As shown in FIG. 1, FIG. 2A and FIG. 2B, the portion 120P1 has a constant thickness (i.e., thickness T1), and the portion 120P2 has a constant thickness (i.e., thickness T2). However, the disclosure is not limited thereto. In some alternative embodiments, referring to FIG. 8, in the semiconductor package 200, the thicknesses of the portion 120P1 change continuously along the direction X, and the thicknesses of the portion 120P2 change continuously along the direction X.

As shown in FIG. 1, FIG. 2A, FIG. 2B and FIG. 3, each of the side surfaces 130S1, 130S2, 130S3 and 130S4 of the semiconductor device 130 is connected with the front surface 130F (i.e., the illustrated bottom surface) and the back surface 130B (i.e., the illustrated top surface) of the semiconductor device 130. The side surface 130S1 of the semiconductor device 130 includes a sub-surface 130S11 and a sub-surface 130S12 connected with each other. In detail, as shown in FIG. 1, FIG. 2A and FIG. 2B, the sub-surface 130S11 is connected with the front surface 130F, and the sub-surface 130S12 is connected with the back surface 130B. That is to say, the side surface 130S1 of the semiconductor device 130 is constituted only by two sub-surfaces (i.e., sub-surface 130S11 and the sub-surface 130S12). However, the disclosure is not limited thereto. In some alternative embodiments, the side surface 130S1 of the semiconductor device 130 may be constituted by more than two sub-surfaces. From another point of view, the sub-surface 130S11 connected with the front surface 130F is nearer to the redistribution structure 110 than the sub-surface 130S12 connected with the back surface 130B.

In some embodiments, the sub-surface 130S11 and the sub-surface 130S12 form an obtuse angle. As shown in FIG. 1, FIG. 2A and FIG. 2B, an included angle θ7 between the sub-surface 130S11 and the sub-surface 130S12 is an obtuse angle. In some embodiments, the included angle θ7 ranges from greater than 91° to less than 180°. In some embodiments, as shown in FIG. 1, FIG. 2A and FIG. 2B, the sub-surface 130S11 and the sub-surface 130S12 are inclined side surfaces. In detail, an included angle θ8 is between the sub-surface 130S11 and a virtual plane P5 parallel with the direction Z, and an included angle θ9 is between the sub-surface 130S12 and a virtual plane P6 parallel with the direction Z. In some embodiments, as shown in FIG. 1, FIG. 2A and FIG. 2B, the included angle θ8 between the sub-surface 130S11 and the virtual plane P5 is greater than the included angle θ9 between the sub-surface 130S12 and the virtual plane P6. That is to say, as shown in FIG. 1, FIG. 2A and FIG. 2B, in the semiconductor device 130, the slope of the sub-surface 130S11 connected with the front surface 130F is less than the slope of the sub-surface 130S12 connected with the sub-surface 130S11. With such configuration, the uniformity of the flow filed of the underfill layer 140 during the formation process of the underfill layer 140 is improved.

As shown in FIG. 1, FIG. 2A and FIG. 2B, the included angles θ7 of the two semiconductor devices 130 are the same to each other, the included angles θ8 of the two semiconductor devices 130 are the same to each other, and the included angles θ9 of the two semiconductor devices 130 are the same to each other. However, the disclosure is not limited thereto. In some alternative embodiments, the included angles θ7 of the two semiconductor devices 130 are different from each other, the included angles θ8 of the two semiconductor devices 130 are different from each other, and/or the included angles θ9 of the two semiconductor devices 130 are different from each other. For example, referring to FIG. 9, in the semiconductor package 300, the included angles θ9 of the two semiconductor devices 130 are the same to each other, while the included angles θ7 of the two semiconductor devices 130 are different from each other, and the included angles θ8 of the two semiconductor devices 130 are different from each other.

Figure 9:
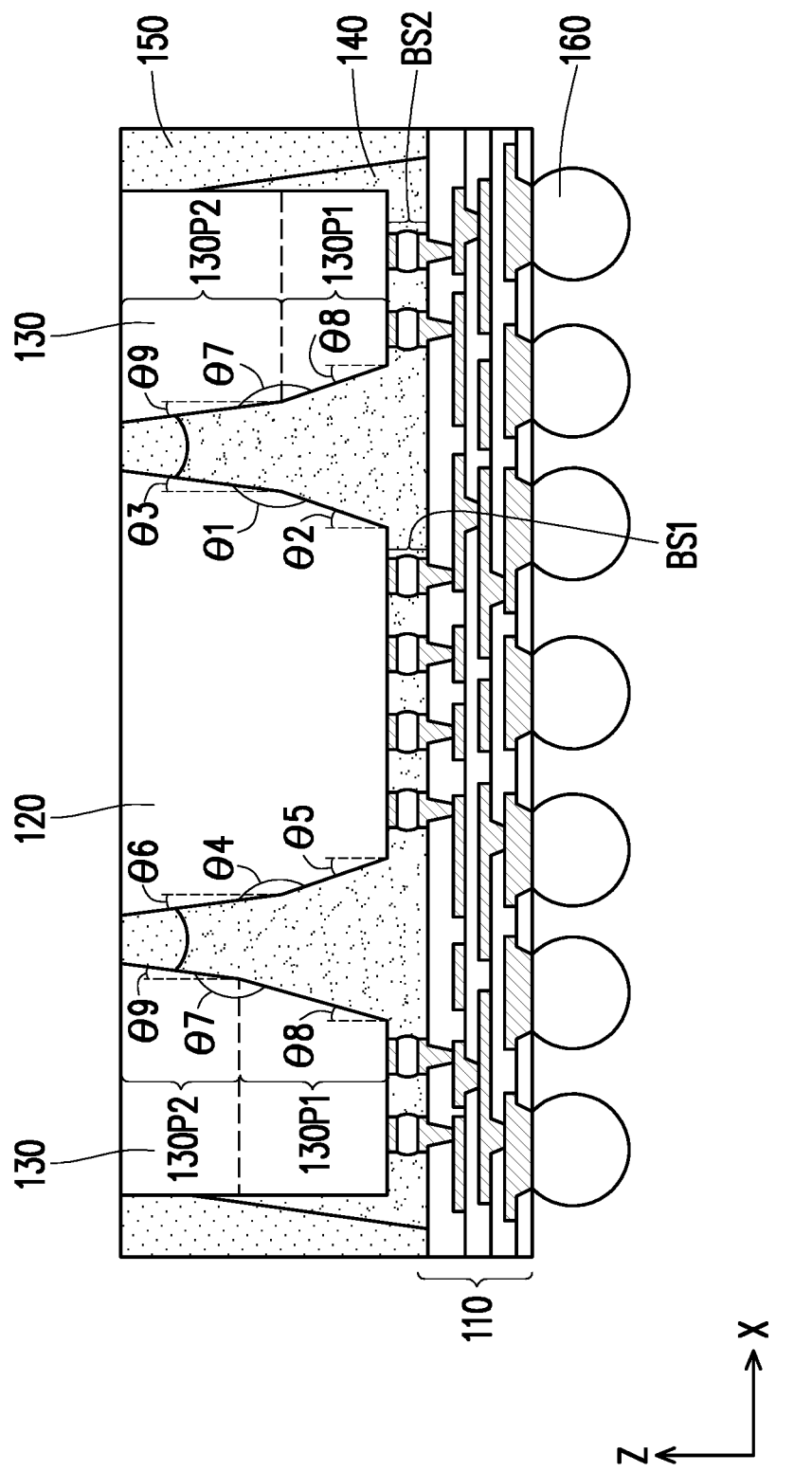
FIG. 9 is a schematic cross-sectional view of a semiconductor package in accordance with some alternative embodiments of the disclosure.

From another point of view, as shown in FIG. 1, FIG. 2A and FIG. 2B, the included angle θ7 of each semiconductor device 130 is the same as the included angle θ1 and the included angle θ4 of the semiconductor device 120, the included angle θ8 of each semiconductor device 130 is the same as the included angle θ2 and the included angle θ5 of the semiconductor device 120, and the included angle θ9 of each semiconductor device 130 is the same as the included angle θ3 and the included angle θ6 of the semiconductor device 120. However, the disclosure is not limited thereto. In some alternative embodiments, the included angle θ7 of the semiconductor device 130 may be different from the included angle θ1 and/or the included angle θ4 of the semiconductor device 120, the included angle θ8 of the semiconductor device 130 may be different from the included angle θ2 and/or the included angle θ5 of the semiconductor device 120, and/or the included angle θ9 of the semiconductor device 130 may be different from the included angle θ3 and/or the included angle θ6 of the semiconductor device 120. For one example, as shown in the embodiment of FIG. 8, the included angles θ7, θ8 and θ9 of one of the semiconductor devices 130 are respectively the same as the included angles θ4, θ5 and θ6 of the semiconductor device 120, while the included angles θ7 and θ8 of another one of the semiconductor devices 130 are respectively different from the included angles θ1 and θ2 of the semiconductor device 120, and the included angle θ9 of another one of the semiconductor devices 130 is the same as the included angle θ3 of the semiconductor device 120. For another example, as shown in the embodiment of FIG. 9, the included angles θ7, θ8 and θ9 of one of the semiconductor devices 130 are respectively the same as the included angles θ1, θ2 and θ3 of the semiconductor device 120, while the included angles θ7 and θ8 of another one of the semiconductor devices 130 are respectively different from the included angles θ4 and θ5 of the semiconductor device 120, and the included angle θ9 of another one of the semiconductor devices 130 is the same as the included angle θ6 of the semiconductor device 120.

In some embodiments, as shown in FIG. 1, FIG. 2A, FIG. 2B and FIG. 3, the side surfaces 130S2, 130S3 and 130S4 of the semiconductor device 130 without facing toward any other semiconductor device are vertical side surfaces. That is to say, the side surfaces 130S2, 130S3 and 130S4 extend substantially along the direction Z. In other words, an extending direction which each of the side surfaces 130S2, 130S3 and 130S4 along with and the direction Z have an angular offset of less than 1°.

In some embodiments, as shown in FIG. 1, FIG. 2A and FIG. 2B, each semiconductor device 130 includes a portion 130P1 and a portion 130P2 stacking on the portion 130P1 along the direction Z. The portion 130P1 has the sub-surface 130S11, and the portion 120P2 has the sub-surface 130S12. That is to say, the portion 130P1 is nearer to the redistribution structure 110 than the portion 130P2. In some embodiments, as shown in FIG. 1, the bonding structures BS2 are in contact with the portion 130P1 of the semiconductor device 130.

In some embodiments, as shown in FIG. 1, FIG. 2A and FIG. 2B, along the direction Z, the thickness T3 of the portion 130P1 is less than the thickness T4 of the portion 130P2. In such configuration of FIG. 1, FIG. 2A and FIG. 2B, each of the included angle θ8 and the included angle θ9 is less than 45 degree and greater than or equal to 1 degree. However, the disclosure is not limited thereto. In some alternative embodiments, along the direction Z, the thickness T3 of the portion 130P1 may be equal to or greater than the thickness T4 of the portion 130P2, and each of the included angle θ8 and the included angle θ9 is less than 30 degree and greater than or equal to 1 degree. With such configuration that each of the included angle θ8 and the included angle θ9 is less than 45 degree and greater than or equal to 1 degree or is less than 30 degree and greater than or equal to 1 degree, the circuit structure(s) and the electrical component(s) of the semiconductor device 130 is prevented from being damaged by the process for forming the sub-surface 130S11 and the sub-surface 130S12.

As shown in FIG. 1, FIG. 2A and FIG. 2B, the thicknesses T3 of the portions 130P1 in the two semiconductor devices 130 are the same to each other, and the thicknesses T4 of the portions 130P2 in the two semiconductor devices 130 are the same to each other. However, the disclosure is not limited thereto. In some alternative embodiments, referring to FIG. 9, in the semiconductor package 300, the thickness T3 of the portion 130P1 in one of the semiconductor devices 130 is different from the thickness T3 of the portion 130P1 in another one of the semiconductor devices 130, and the thickness T4 of the portion 130P2 in one of the semiconductor devices 130 is different from the thickness T4 of the portion 130P2 in another one of the semiconductor devices 130.

In some embodiments, as shown in FIG. 1, FIG. 2A, FIG. 2B and FIG. 3, the semiconductor device 130 is laterally separated from the semiconductor device 120. That is to say, the semiconductor device 130 is spaced apart from the semiconductor device 120 along the direction X. In other words, along the direction X, the side surface 120S1 of the semiconductor device 120 is spaced apart from the side surface 130S1 of the corresponding semiconductor device 130, and the side surface 120S3 of the semiconductor device 120 is spaced apart from the side surface 130S1 of the corresponding semiconductor device 130. In detail, as shown in FIG. 1, FIG. 2A, FIG. 2B and FIG. 3, along the direction X, the sub-surface 120S11 of the semiconductor device 120 is separated from the sub-surface 130S11 of the corresponding semiconductor device 130 by a maximum distance D1, the sub-surface 120S31 of the semiconductor device 120 is separated from the sub-surface 130S11 of the corresponding semiconductor device 130 by a maximum distance D3, the sub-surface 120S12 of the semiconductor device 120 is separated from the sub-surface 130S12 of the corresponding semiconductor device 130 by a minimum distance D2, and the sub-surface 120S32 of the semiconductor device 120 is separated from the sub-surface 130S12 of the corresponding semiconductor device 130 by a minimum distance D4.

In some embodiments, as shown in FIG. 1, FIG. 2A, FIG. 2B and FIG. 3, due to the coplanarity of the front surface 120F and the front surface 130F and the coplanarity of the back surface 120B and the back surface 130B, the maximum distance D1 between the sub-surface 120S11 and the sub-surface 130S11 is the minimum distance between the front surface 120F and the front surface 130F, the maximum distance D3 between the sub-surface 120S31 and the sub-surface 130S11 is the minimum distance between the front surface 120F and the front surface 130F, the minimum distance D2 between the sub-surface 120S12 and the sub-surface 130S12 is the minimum distance between the back surface 120B and the back surface 130B, and the minimum distance D4 between the sub-surface 120S32 and the sub-surface 130S12 is the minimum distance between the back surface 120B and the back surface 130B. However, the disclosure is not limited thereto. In some alternative embodiments, when the front surface 130F is at higher level than the front surface 120F (i.e., the front surface 120F is not coplanar with the front surface 130F), the maximum distance D1 between the sub-surface 120S11 and the sub-surface 130S11 may be the minimum distance between the front surface 130F and the sub-surface 120S11 along the direction X. Similarly, in some alternative embodiments, when the back surface 120B is at higher level than the back surface 130B (i.e., the back surface 120B is not coplanar with the back surface 130B), the maximum distance D2 between the sub-surface 120S12 and the sub-surface 130S12 may be the minimum distance between the back surface 130B and the sub-surface 120S12 along the direction X.

From another point of view, as shown in FIG. 1, FIG. 2A, FIG. 2B and FIG. 3, the maximum distance D1 between the sub-surface 120S11 and the sub-surface 130S11 and the minimum distance D2 between the sub-surface 120S12 and the sub-surface 130S12 respectively are the bottommost lateral dimension and the topmost lateral dimension of the space S1 between the semiconductor device 120 and the semiconductor device 130 and defined by the sub-surface 120S11, the sub-surface 130S11, the sub-surface 120S12 and the sub-surface 130S12. Also, the maximum distance D3 between the sub-surface 120S31 and the sub-surface 130S11 and the minimum distance D4 between the sub-surface 120S32 and the sub-surface 130S12 respectively are the bottommost lateral dimension and the topmost lateral dimension of the space S2 between the semiconductor device 120 and the semiconductor device 130 and defined by the sub-surface 120S31, the sub-surface 130S11, the sub-surface 120S32 and the sub-surface 130S12.

In some embodiments, the minimum distance D2 and the minimum distance D4 each are less than 400 μm. In some embodiments, the maximum distance D1 between the sub-surface 120S11 and the sub-surface 130S11 is greater than the minimum distance D2 between the sub-surface 120S12 and the sub-surface 130S12, and the maximum distance D3 between the sub-surface 120S31 and the sub-surface 130S11 is greater than the minimum distance D4 between the sub-surface 120S32 and the sub-surface 130S12. That is to say, the lateral dimensions of the space S1 decrease continuously along a direction from the front surface 120F of the semiconductor device 120 to the back surface 120B of the semiconductor device 120 and parallel with the direction Z. Also, the lateral dimensions of the space S2 decrease continuously along a direction from the front surface 120F of the semiconductor device 120 to the back surface 120B of the semiconductor device 120 and parallel with the direction Z. In other words, the minimum distance by which the side surface 120S1 of the semiconductor device 120 is laterally separated from the side surface 130S1 of the corresponding semiconductor device 130 is the minimum distance D2 between the sub-surface 120S12 and the sub-surface 130S12, and the minimum distance by which the side surface 120S3 of the semiconductor device 120 is laterally separated from the side surface 130S1 of the corresponding semiconductor device 130 is the minimum distance D4 between the sub-surface 120S32 and the sub-surface 130S12. In certain embodiments, the maximum distance D1 between the sub-surface 120S11 and the sub-surface 130S11 is greater than 1.25 times of the minimum distance D2 between the sub-surface 120S12 and the sub-surface 130S12, and the maximum distance D3 between the sub-surface 120S31 and the sub-surface 130S11 is greater than 1.25 times of the minimum distance D4 between the sub-surface 120S32 and the sub-surface 130S12.

In the conventional case that the space between two semiconductor devices has the constant lateral dimension which is less than 400 μm, during the formation process of the underfill layer, the uniformity of the flow filed of the underfill layer is poor, such that the voids are easily formed in the underfill layer, reducing the mechanical stability of the semiconductor package. In view of this, by virtue of arranging the space (e.g., space S1 or space S2) between two semiconductor devices (e.g., semiconductor devices 120, 130) with the lateral dimensions decreasing continuously along a direction from the front surfaces (e.g., front surfaces 120F, 130F) to the back surfaces (e.g., back surfaces 120B, 130B) of the two semiconductor devices and with the minimum lateral dimension being less than 400 μm, the uniformity of the flow filed of the underfill layer (e.g., underfill layer 140) is improved, such that void issues seen in the conventional underfill layer can be eliminated, thereby improving the mechanical stability of the semiconductor package (e.g., semiconductor package 100).

The method of forming the semiconductor package 100 will be described in details below with reference to FIG. 4A to FIG. 6F. FIG. 4A to FIG. 4E are schematic cross-sectional views illustrating a manufacturing process of the semiconductor device 120 in accordance with some embodiments of the disclosure. FIG. 6A to FIG. 6C are schematic cross-sectional views illustrating a manufacturing process of the semiconductor device 130 in accordance with some embodiments of the disclosure.

Figure 4A:
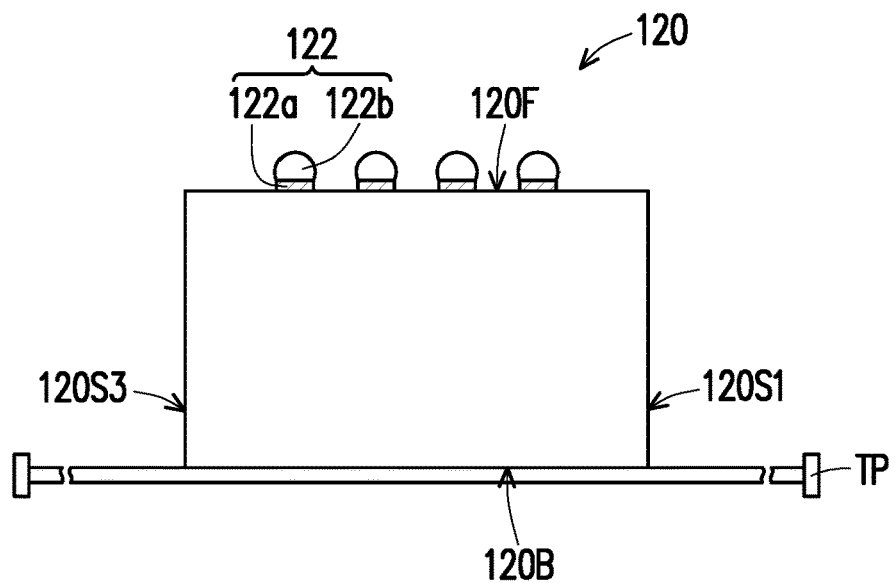
FIG. 4A to FIG. 4E are schematic cross-sectional views illustrating a manufacturing process of a semiconductor device in accordance with some embodiments of the disclosure.

Referring to FIG. 4A, at least one semiconductor device 120 is provided. At this stage, the side surface 120S1 and the side surface 120S3 of the semiconductor device 120 are vertical side surfaces, as shown in FIG. 4A. In some embodiments, the semiconductor device 120 includes a plurality of connector structures 122 disposed at the front surface 120F. In some embodiments, the connector structure 122 is a micro-bump containing a conductive connector 122a and a solder cap 122b on the conductive connector 122a. However, the disclosure is not limited thereto. In some alternative embodiments, the connector structure 122 may be other conductive structure, such as solder bump, gold bump or copper bump. In some embodiments, the conductive connector 122a is a copper pillar, a copper post, a copper pad, or the like.

The semiconductor device 120 may be formed in a semiconductor wafer (not shown). For example, the semiconductor wafer is processed to include multiple device regions, and then after formation, the semiconductor wafer may be tested. For example, each device region of the semiconductor wafer is probed and tested for functionality and performance, and the known good devices are selected and used for subsequently processing. In some embodiments, the semiconductor wafer is attached to a temporary carrier or a frame including an adhesive tape, and then the semiconductor wafer is singulated along scribe lines (not shown) to form individual semiconductor device 120. For example, the tape frame TP is used for holding the semiconductor wafer in place during the singulation process. As shown in FIG. 4A, the back surface 120B of the semiconductor device 120 is attached to the tape frame TP. In some embodiments, the singulation process is performed along scribe lines (not shown) by a laser cutting process. It is noted that although one semiconductor device 120 is shown for simplicity in FIG. 4A, the disclosure is not limited by the embodiments or figures shown herein, and those skilled in the art can understand that more than one semiconductor device 120 arranged in an array are provided on the tape frame TP.

Figure 4B:
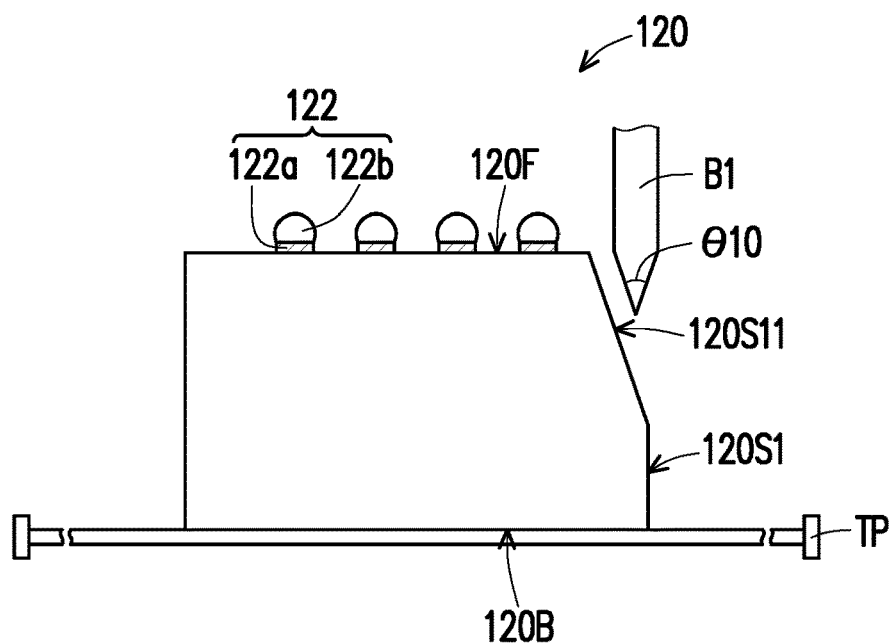

Referring to FIG. 4B, a post-cut process is performed to cut the semiconductor device 120, such that the sub-surface 120S11 is formed at the side surface 120S1. In some embodiments, the post-cut process for forming the sub-surface 120S11 is performed by a mechanical cutting process with a blade. That is to say, the sub-surface 120S11 is formed through a contact cutting process. In detail, as shown in FIG. 4B, the blade B1 with a taper angle θ10 is used to render the sub-surface 120S11. In some embodiments, the taper angle θ10 from greater than or equal to 1° to less than 45°. In some alternative embodiments, the taper angle θ10 from greater than or equal to 1° to less than 30°.

Figure 4C:
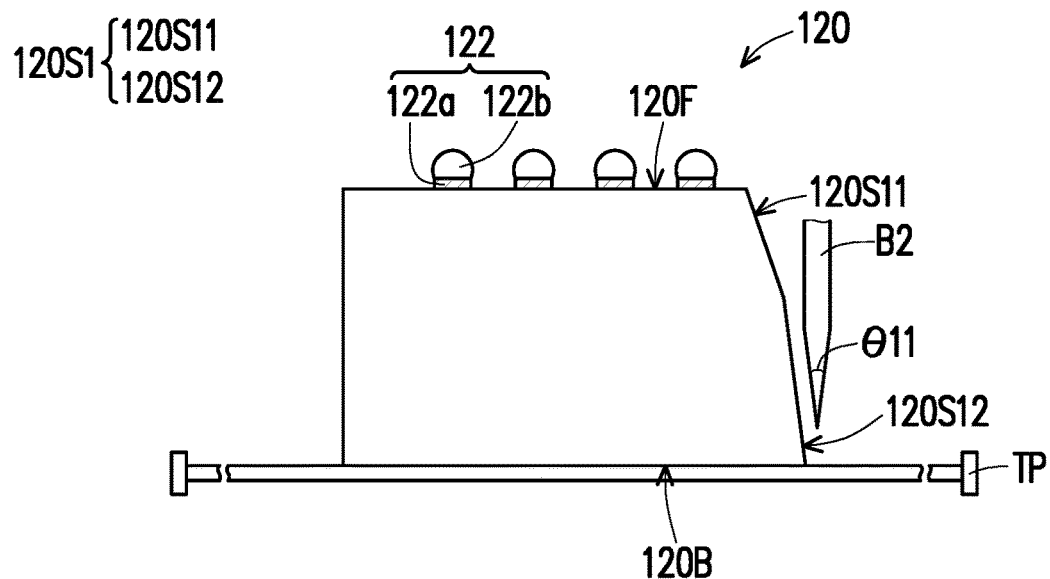

Referring to FIG. 4C, after the sub-surface 120S11 is formed, another post-cut process is performed to cut the semiconductor device 120, such that the sub-surface 120S12 is formed at the side surface 120S1. In some embodiments, the post-cut process for forming the sub-surface 120S12 is performed by a mechanical cutting process with a blade. That is to say, the sub-surface 120S11 is formed through a contact cutting process. In detail, as shown in FIG. 4C, the blade B2 with a taper angle θ11 is used to render the sub-surface 120S12. In some embodiments, as shown in FIG. 4B and FIG. 4C, the taper angle θ11 of the blade B2 is less than the taper angle θ10 of the blade B1. That is to say, the side surface 120S1 having the sub-surface 120S11 and the sub-surface 120S12 is formed by separated post-cut processes with different blades (e.g., blades B1, B2). In some embodiments, the taper angle θ11 from greater than 0° to less than 45°. In some alternative embodiments, the taper angle θ11 from greater than 0° to less than 30°.

Figure 4D:
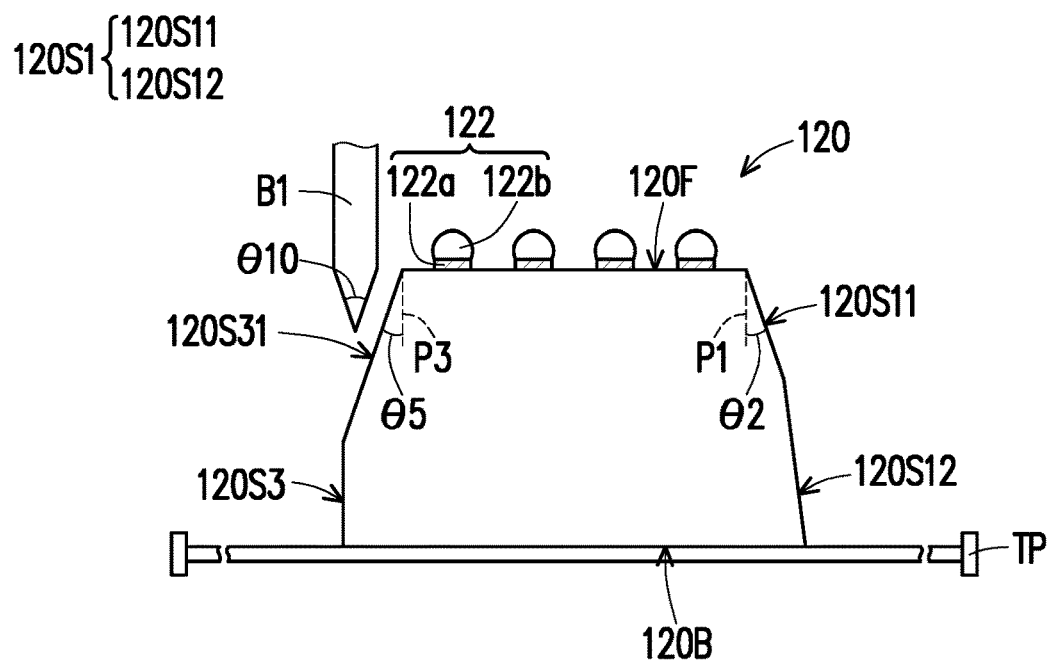

Referring to FIG. 4D, after the side surface 120S1 having the sub-surface 120S11 and the sub-surface 120S12 is formed, the post-cut process used the blade B1 is performed to cut the semiconductor device 120, such that the sub-surface 120S31 is formed at the side surface 120S3. That is to say, the post-cut process for forming the sub-surface 120S31 is the same as the post-cut process for forming the sub-surface 120S11 by using the same blade B1, which is because the included angle θ2 between the sub-surface 120S11 and the virtual plane P1 is equal to the included angle θ5 between the sub-surface 120S31 and the virtual plane P3, as shown in FIG. 4D.

Figure 4E:
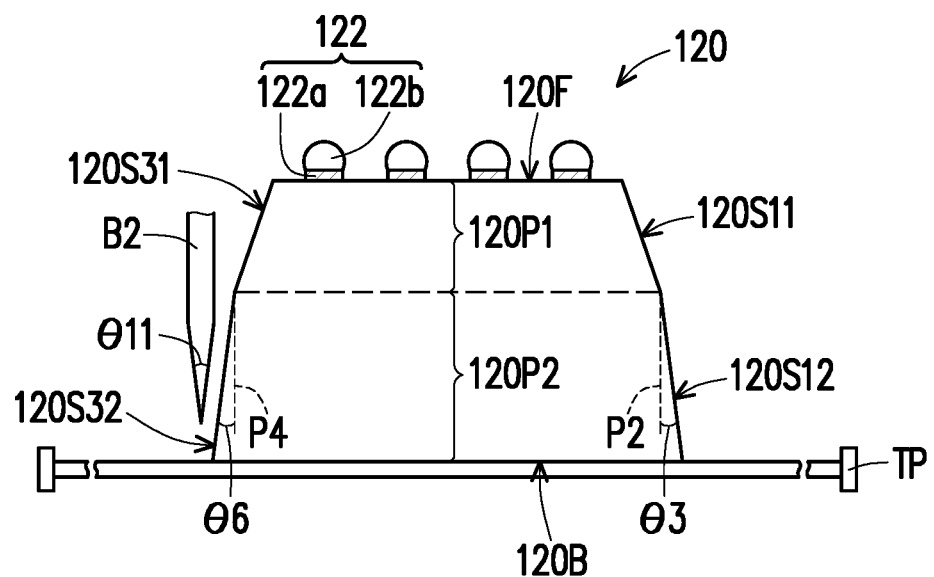

Referring to FIG. 4E, after the sub-surface 120S31 is formed, the post-cut process used the blade B2 is performed to cut the semiconductor device 120, such that the sub-surface 120S32 is formed at the side surface 120S3. That is to say, the post-cut process for forming the sub-surface 120S32 is the same as the post-cut process for forming the sub-surface 120S12 by using the same blade B2, which is because the included angle θ3 between the sub-surface 120S11 and the virtual plane P2 is equal to the included angle θ6 between the sub-surface 120S31 and the virtual plane P4, as shown in FIG. 4E. From another point of view, as shown in FIG. 4E, after the sub-surface 120S32 is formed, the portion 120P1 and the portion 120P2 under the portion 120P1 of the semiconductor device 120 are rendered. Up to here, the semiconductor device 120 with the inclined side surfaces used for forming the semiconductor package 100 has been formed. And, the semiconductor device 120 with the inclined side surfaces may be bonded to the redistribution structure 110 in a subsequent process as will be described later in detail accompanying with FIG. 6A to FIG. 6B.

In the illustrated embodiment shown in FIG. 4A to FIG. 4E, the side surface 120S1 having the sub-surface 120S11 and the sub-surface 120S12 is formed followed by forming the sub-surface 120S31. However, the disclosure is not limited thereto. In some alternative embodiments, the sub-surface 120S11 and the sub-surface 120S31 formed by using the same blade B1 may be formed followed by forming the sub-surface 120S12 and the sub-surface 120S32 with the same blade B2. Further, according to descriptions with respect to FIG. 4A to FIG. 4E, it may be deduced that in the embodiment where the included angle θ2 and the included angle θ3 are respectively different from the included angle θ5 and the included angle θ6, the sub-surface 120S11, the sub-surface 120S31, the sub-surface 120S31 and the sub-surface 120S32 are formed by different post-cut processes used different blades with different taper angles. Further, in the illustrated embodiment shown in FIG. 4A to FIG. 4E, the mechanical blade cutting processes for forming the sub-surfaces 120S11, 120S12, 120S31 and 120S32 are performed after the singulation process performed by the laser cutting process. However, the disclosure is not limited thereto. In the embodiment where each of the side surfaces 120S1, 120S2, 120S3 and 120S4 of the semiconductor device 120 has at least two inclined sub-surfaces, the singulation process performed to separate the individual semiconductor devices 120 is performed by a mechanical cutting process with at least two blades.

Figure 5A:
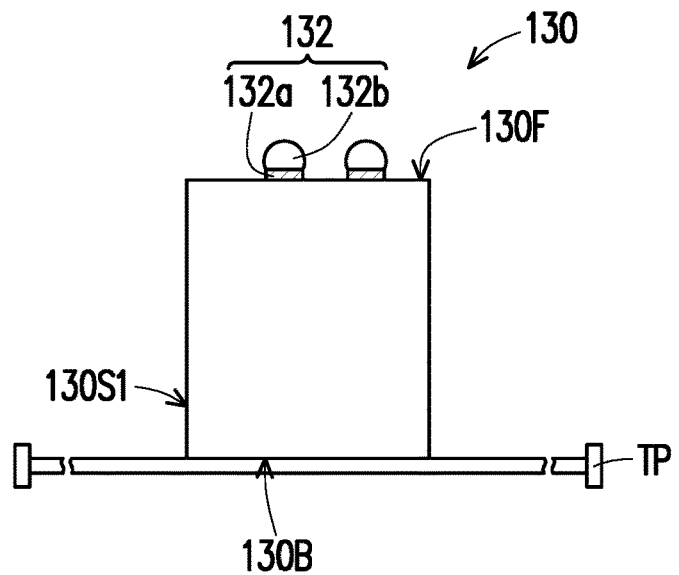
FIG. 5A to FIG. 5C are schematic cross-sectional views illustrating a manufacturing process of a semiconductor device in accordance with some embodiments of the disclosure.
Figure 6A:
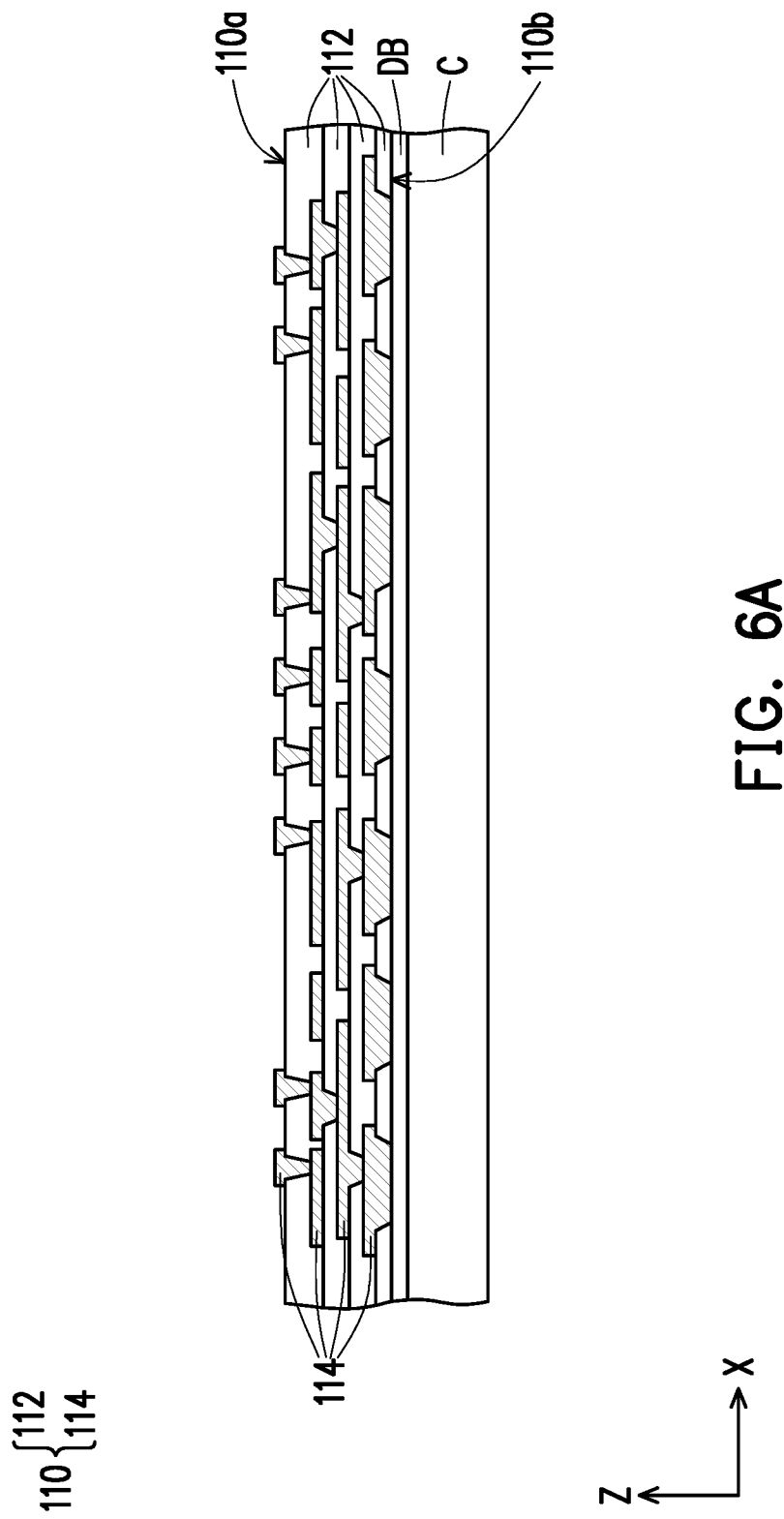
FIG. 6A to FIG. 6F are schematic cross-sectional views illustrating a manufacturing process of a semiconductor package in accordance with some embodiments of the disclosure.
Figure 6B:
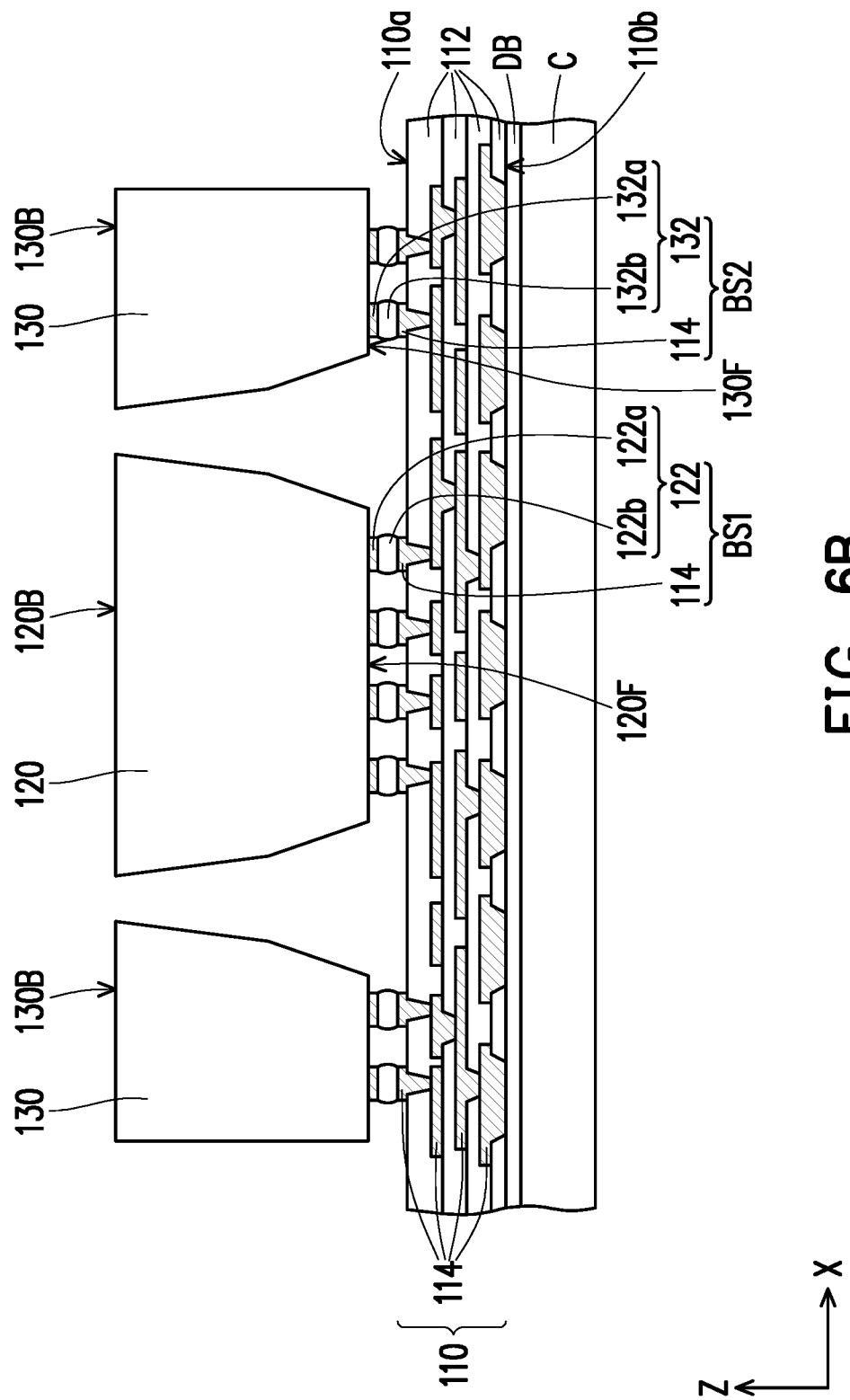
Figure 6C:
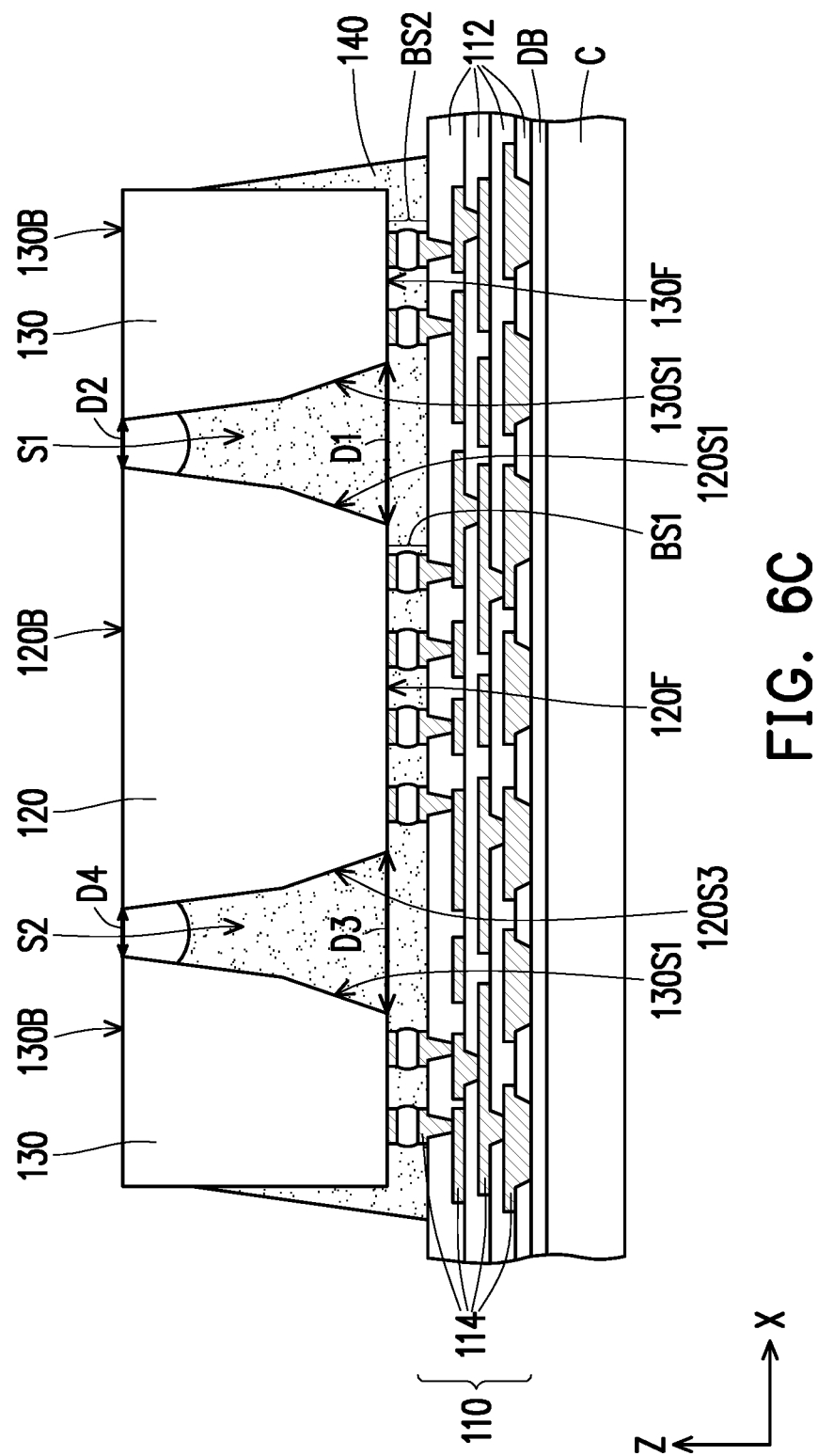

Referring to FIG. 5A, at least one semiconductor device 130 is provided. At this stage, the side surface 130S1 of the semiconductor device 130 is a vertical side surface, as shown in FIG. 5A. In some embodiments, the semiconductor device 130 includes a plurality of connector structures 132 disposed at the front surface 130F. In some embodiments, the connector structure 132 is a micro-bump containing a conductive connector 132a and a solder cap 132b on the conductive connector 132a. However, the disclosure is not limited thereto. In some alternative embodiments, the connector structure 132 may be other conductive structure, such as solder bump, gold bump or copper bump. In some embodiments, the conductive connector 132a is a copper pillar, a copper post, a copper pad, or the like.

The semiconductor device 130 may be formed in a semiconductor wafer (not shown). For example, the semiconductor wafer is processed to include multiple device regions, and then after formation, the semiconductor wafer may be tested. For example, each device region of the semiconductor wafer is probed and tested for functionality and performance, and the known good devices are selected and used for subsequently processing. In some embodiments, the semiconductor wafer is attached to a temporary carrier or a frame including an adhesive tape, and then the semiconductor wafer is singulated along scribe lines (not shown) to form individual semiconductor device 130. For example, the tape frame TP is used for holding the semiconductor wafer in place during the singulation process. As shown in FIG. 5A, the back surface 130B of the semiconductor device 130 is attached to the tape frame TP. In some embodiments, the singulation process is performed along scribe lines (not shown) by a laser cutting process. It is noted that although one semiconductor device 130 is shown for simplicity in FIG. 5A, the disclosure is not limited by the embodiments or figures shown herein, and those skilled in the art can understand that more than one semiconductor device 130 arranged in an array are provided on the tape frame TP.

Figure 5B:
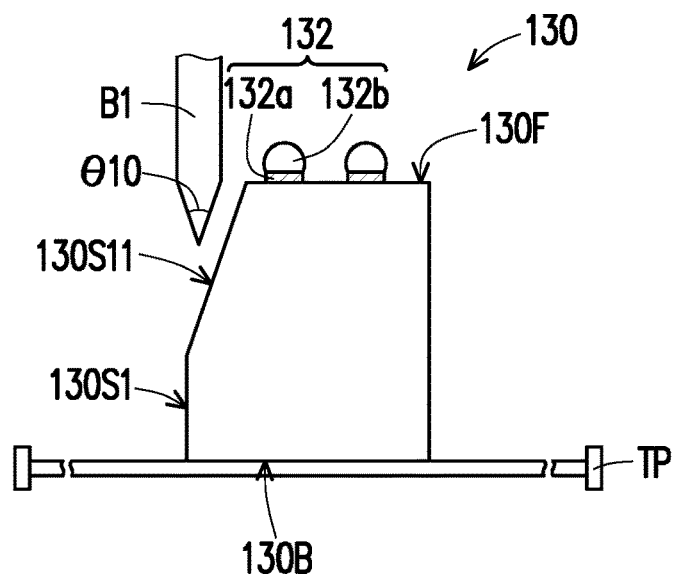
Figure 5C:
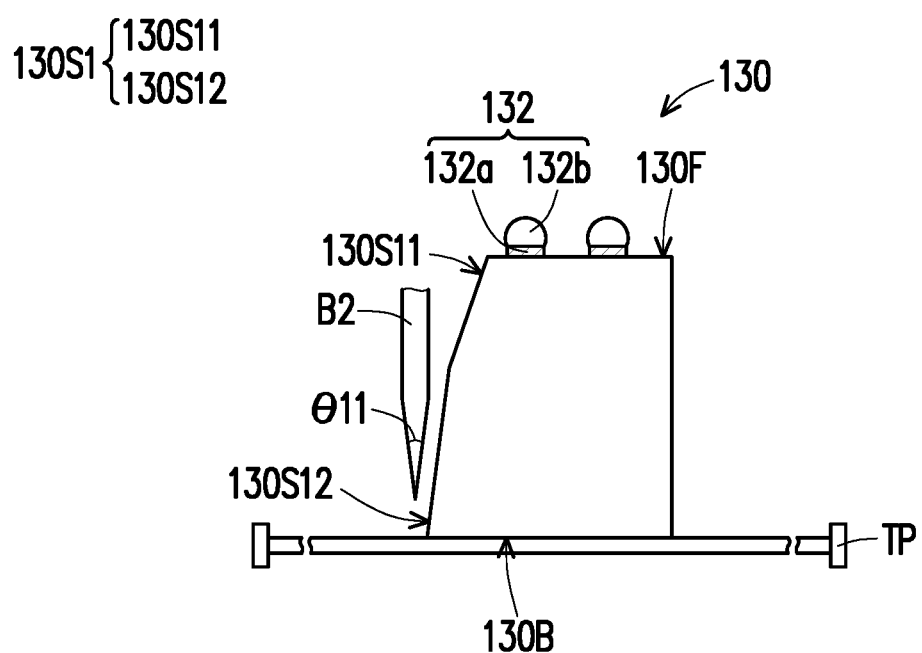

According to the descriptions with respect to FIG. 1, FIG. 2A, FIG. 2B, FIG. 3 and FIG. 4A to FIG. 4E, those skilled in the art should understand that the post-cut processes described above in conjunction with FIG. 4B and FIG. 4C can be applied to form the sub-surface 130S11 and the sub-surface 130S12 of the semiconductor device 130. In detail, as shown in FIG. 5B, the blade B1 is used to render the sub-surface 130S11, and then as shown in FIG. 5C, the blade B2 is used to render the sub-surface 130S12. Up to here, the semiconductor device 130 with the inclined side surfaces used for forming the semiconductor package 100 has been formed. And, the semiconductor device 130 with the inclined side surfaces may be bonded to the redistribution structure 110 in a subsequent process as will be described later in detail accompanying with FIG. 6A to FIG. 6B.

FIG. 6A to FIG. 6F are schematic cross-sectional views illustrating a manufacturing process of the semiconductor package 100 in accordance with some embodiments of the disclosure. In exemplary embodiments, the following manufacturing process is part of a wafer level packaging process. In detail, one semiconductor package is shown to represent plural semiconductor packages obtained following the manufacturing process. That is to say, a single package region is illustrated in FIG. 6A to FIG. 6F, and the semiconductor package 100 (see FIG. 1) is formed in the illustrated package region.

Referring to FIG. 6A, a carrier C having a de-bonding layer DB formed thereon is provided. In some embodiments, the carrier C is a glass substrate. However, other material may be adapted as a material of the carrier C as long as the material is able to withstand the subsequent processes while carrying the package structure formed thereon. In some embodiments, the de-bonding layer DB is a light-to-heat conversion (LTHC) release layer formed on the glass substrate. The de-bonding layer DB may allow the structure formed on the carrier C in the subsequent processes to be peeled off from the carrier C.

The redistribution structure 110 is then formed over the carrier C and the de-bonding layer DB. The redistribution structure 110 has a first surface 110a and a second surface 110b opposite to the first surface 110a. In some embodiments, the second surface 110b faces the carrier C. In some embodiments, the second surface 110b is attached to the de-bonding layer DB.

In some embodiments, the formation of the redistribution structure 110 includes sequentially forming multiple dielectric layers 112 and multiple conductive layers 114 in alternation along the direction Z parallel with a normal direction of the carrier C. As shown in FIG. 6A, the conductive layers 114 are sandwiched between the dielectric layers 112, but the illustrated top surface of the topmost layer of the conductive layers 114 is exposed by the topmost layer of the dielectric layers 112, and the bottommost layer of the conductive layers 114 is exposed by the bottommost layer of the dielectric layers 112. The exposed topmost layer of the conductive layers 114 functions to serve the purpose of electrical connection with the semiconductor device 120 and the semiconductor devices 130. In some embodiments, the exposed topmost layer of the conductive layers 114 includes a plurality of under-bump metallurgy patterns. In some embodiments, the exposed topmost layer of the conductive layers 114 includes a plurality of pads. The foregoing pads may include redistribution pads (routing pads) and/or bump pads. In some embodiments, the exposed topmost layer of the conductive layers 114 includes a plurality of micro-bumps. The exposed bottommost layer of the conductive layers 114 functions to serve the purpose of electrical connection with the later-formed electrical terminals 160. In some embodiments, the exposed bottommost layer of the conductive layers 114 includes a plurality of under-bump metallurgy patterns.

It should be noted that although four conductive layers 114 and four dielectric layers 112 are illustrated in FIG. 6A, the number of these layers is not limited in this disclosure. In some alternative embodiments, the redistribution structure 110 may be constituted by more or less layers of the conductive layer 114 and the dielectric layer 112 depending on the circuit design.

In some embodiments, the material of the conductive layer 114 includes aluminum, titanium, copper, nickel, tungsten, and/or alloys thereof. The conductive layer 114 may be formed by, for example, electroplating, deposition, and/or photolithography and etching. In some embodiments, the material of the dielectric layer 112 includes polyimide, epoxy resin, acrylic resin, phenol resin, benzocyclobutene (BCB), PBO, or any other suitable polymer-based dielectric material. The dielectric layer 112 may be formed by suitable fabrication techniques such as spin-on coating, chemical vapor deposition (CVD), plasma-enhanced chemical vapor deposition (PECVD) or the like.

Referring to FIG. 6B, the semiconductor device 120 and the semiconductor devices 130 are mounted to the redistribution structure 110 in a flip-chip bonding. That is, each of the semiconductor device 120 and the semiconductor devices 130 is upside down, so that the front surface 120F of the semiconductor device 120 and the front surface 130F of each semiconductor device 130 face toward the carrier C. In detail, as shown in FIG. 6B, the connector structures 122 of the semiconductor device 120 are bonded to the corresponding portions (e.g., pads, micro-bumps) of the exposed topmost layer of the conductive layers 114 to form the bonding structures BS1, and the connector structures 132 of each semiconductor device 130 are bonded to the other corresponding portions (e.g., pads, micro-bumps) of the exposed topmost layer of the conductive layers 114 to form the bonding structures BS2. In some embodiments, the semiconductor device 200 and the semiconductor devices 130 are bonded on the redistribution structure 110 through a reflowing process, or other suitable processes. In some embodiments, a solder flux (not shown) may be applied onto the connector structures 122 and/or the connector structures 132 for better adhesion. Further, in some embodiments, the redistribution structure 110 is referred to as an organic interposer. However, the disclosure is not limited thereto. In some alternative embodiments, the redistribution structure 110 may be a inorganic interposer.

In the illustrated embodiment shown in FIG. 6A to FIG. 6B, the exposed topmost layer of the conductive layers 114 for connecting with the semiconductor device 120 and the semiconductor devices 130 is solder free. However, the disclosure is not limited thereto. In some alternative embodiments, a solder cap layer may be formed on the top of the exposed topmost layer of the conductive layers 114. The solder cap layer may be formed by a plating process. Further, in the illustrated embodiment shown in FIG. 6A to FIG. 6B, the connector structure 122 of the semiconductor device 120 includes the solder cap 122b on the conductive connector 122a, and the connector structure 132 of the semiconductor device 130 includes the solder cap 132b on the conductive connector 132a. However, the disclosure is not limited thereto. In some alternative embodiments, the connector structure 122 of the semiconductor device 120 includes the conductive connector 122a without the solder cap thereon, and the connector structure 132 of the semiconductor device 130 includes the conductive connector 132a without the solder cap thereon.

Referring to FIG. 6A and FIG. 6B, the redistribution structure 110 is formed prior to the placement of the semiconductor devices 120 and 130, and thus the foregoing process is considered as a "RDL first method." By adopting the RDL first method to form the redistribution structure 110 and the semiconductor devices 120 and 130 over the carrier C, the subsequently formed semiconductor package 100 can be formed without being constrained by the fan-out ratio (i.e., the ratio of die area to package area). Moreover, since the semiconductor devices 120 and 130 are coupled to the first surface 110a of the redistribution structure 110 through flip-chip bonding, a die attach film (DAF) or a film on wire (FOW) utilized in conventional package structures for adhering the semiconductor devices is eliminated. As a result, an overall thickness of the subsequently formed semiconductor package 100 may be effectively reduced.

Referring to FIG. 6C, after the semiconductor device 120 and the semiconductor devices 130 are connected with the redistribution structure 110, the underfill layer 140 is formed on the redistribution structure 110. In some embodiments, as shown in FIG. 6C, the underfill layer 140 is formed to fill the space S1 between the semiconductor device 120 and the semiconductor device 130, the space S2 between the semiconductor device 120 and the semiconductor device 130, the space between the semiconductor device 120 and the redistribution structure 110, and the space between each semiconductor device 130 and the redistribution structure 110, so as to cover the front surface 120F of the semiconductor device 120, the front surface 130F of each semiconductor device 130 and a portion of the topmost layer of the conductive layers 114, and surrounds the bonding structures BS1 and the bonding structures BS2. In some embodiments, the underfill layer 140 includes polymer such as epoxy. In some embodiments, the underfill layer 140 is formed by a capillary flow process after the semiconductor device 120 and the semiconductor devices 130 are attached. That is to say, the underfill layer 140 is drawn by capillary action to flow through the space S1, the space S2, the space between the semiconductor device 120 and the redistribution structure 110, and the space between each semiconductor device 130 and the redistribution structure 110.

As shown in FIG. 6C, since the space S1 between the semiconductor device 120 and the semiconductor device 130 and formed and sandwiched by the side surface 120S1 and side surface 130S1 has the lateral dimensions decreasing continuously along a direction from the front surface 120F to the back surface 120B, and the space S2 between the semiconductor device 120 and the semiconductor device 130 and formed and sandwiched by the side surface 120S3 and side surface 130S1 has the lateral dimensions decreasing continuously along a direction from the front surface 120F to the back surface 120B, the capillary driving force caused by the side surface 120S1 and side surface 130S1 as well as the side surface 120S3 and side surface 130S1 is reduced. Accordingly, during the formation process of the underfill layer 140, the uniformity of the flow filed of the underfill layer 140 is improved, and void issues can be prevented from the underfill layer 140, thereby improving the mechanical stability of the semiconductor package 100.

Figure 7:
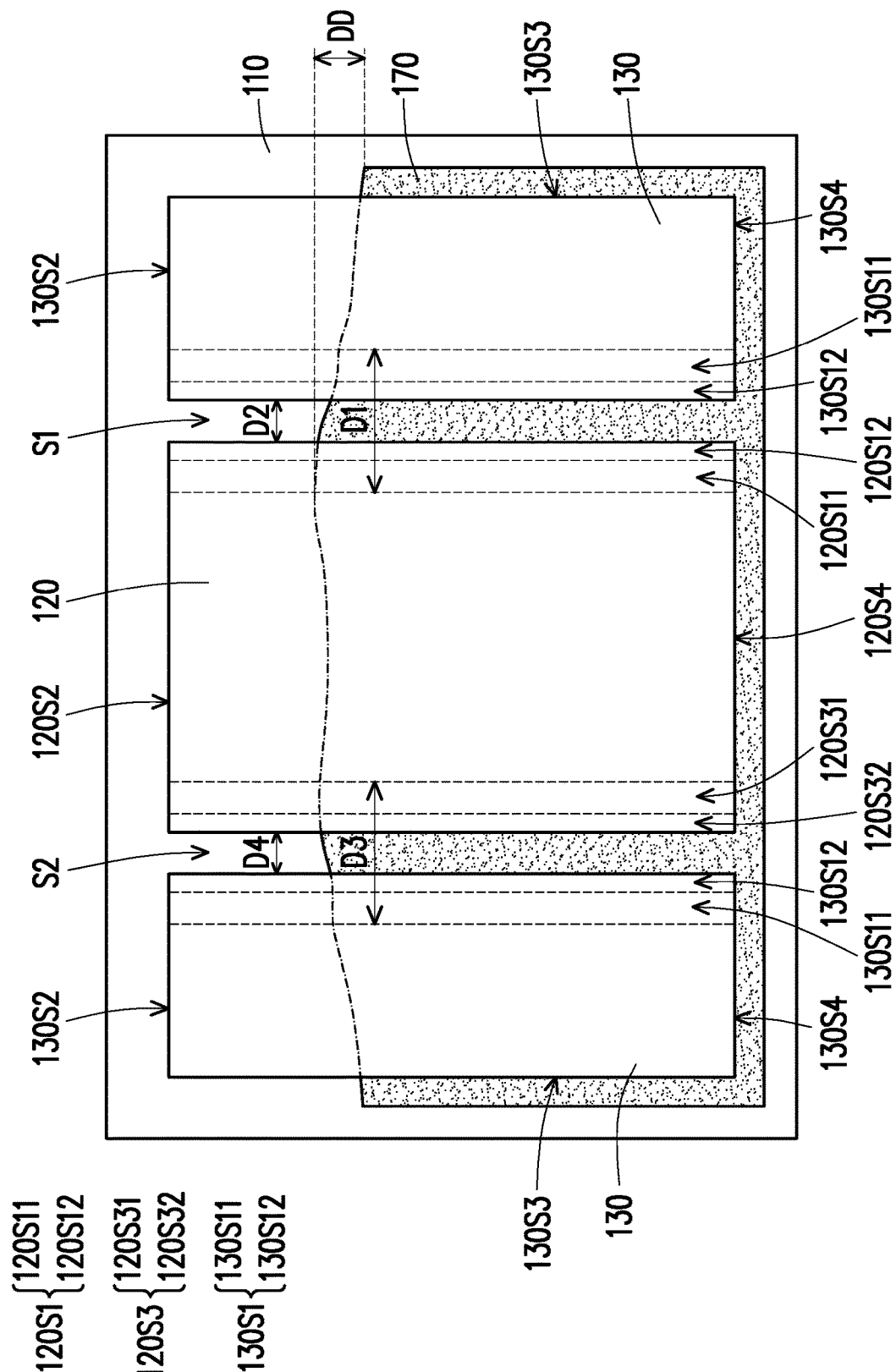
FIG. 7 is a schematic top view illustrating an intermediate stage during the formation of the underfill layer in the stage of FIG. 6C.

In the embodiment where the maximum distance D1 (i.e., the maximum lateral dimension of the space S1) is greater than the minimum distance D2 (i.e., the minimum lateral dimension of the space S1), the maximum distance D3 (i.e., the maximum lateral dimension of the space S2) is greater than the minimum distance D4 (i.e., the minimum lateral dimension of the space S2), and the minimum distance D2 and the minimum distance D4 each are less than 400 μm, the distance difference DD at the flow front of the underfill layer 140 is less than 5 mm, as shown in FIG. 7. That is to say, during the formation process of the underfill layer 140, the underfill layer 140 has uniform flow front speed. In another embodiment where the maximum distance D1 (i.e., the maximum lateral dimension of the space S1) is greater than 1.25 times of the minimum distance D2 (i.e., the minimum lateral dimension of the space S1), the maximum distance D3 (i.e., the maximum lateral dimension of the space S2) is greater than 1.25 times of the minimum distance D4 (i.e., the minimum lateral dimension of the space S2), and the minimum distance D2 and the minimum distance D4 each are less than 400 μm, the distance difference DD at the flow front of the underfill layer 140 is less than 4.5 mm.

Figure 6D:
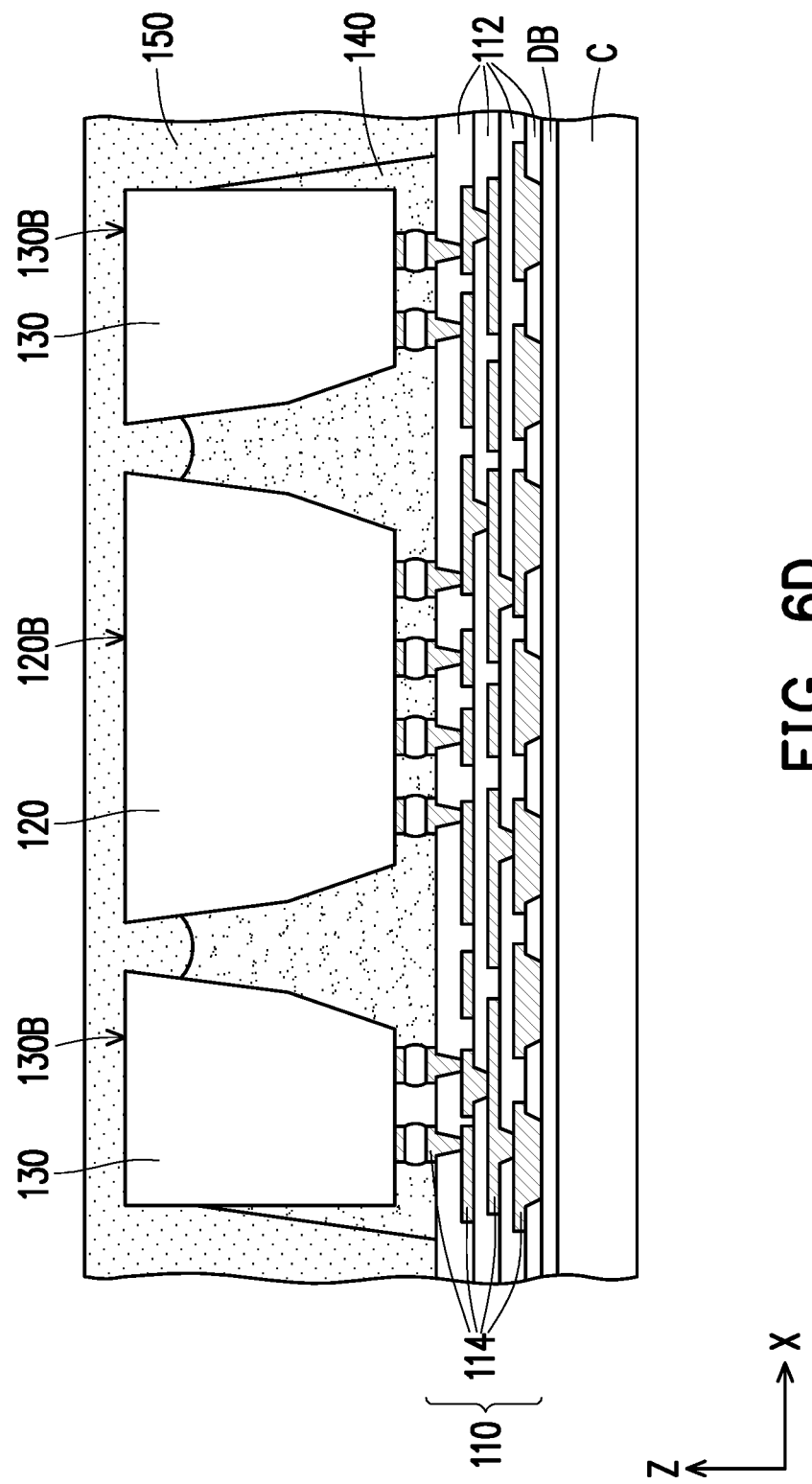

Referring to FIG. 6D, the encapsulant 150 is formed over the redistribution structure 110 to encapsulate the semiconductor device 120, the semiconductor devices 130 and the underfill layer 140. During this stage, the semiconductor device 120 and the semiconductor devices 130 are fully encapsulated by the encapsulant 150, without exposing the back surface 120B of the semiconductor device 120 and the back surfaces 130B of the semiconductor devices 130, as shown in FIG. 6D. That is to say, at this stage, the semiconductor device 120 and the semiconductor devices 130 are not revealed and are well protected by the encapsulant 150. In some embodiments, the encapsulant 150 is a molding compound formed by an over-molding process. In some alternative embodiments, the material of the encapsulant 150 includes epoxy resins or other suitable resins.

Figure 6E:
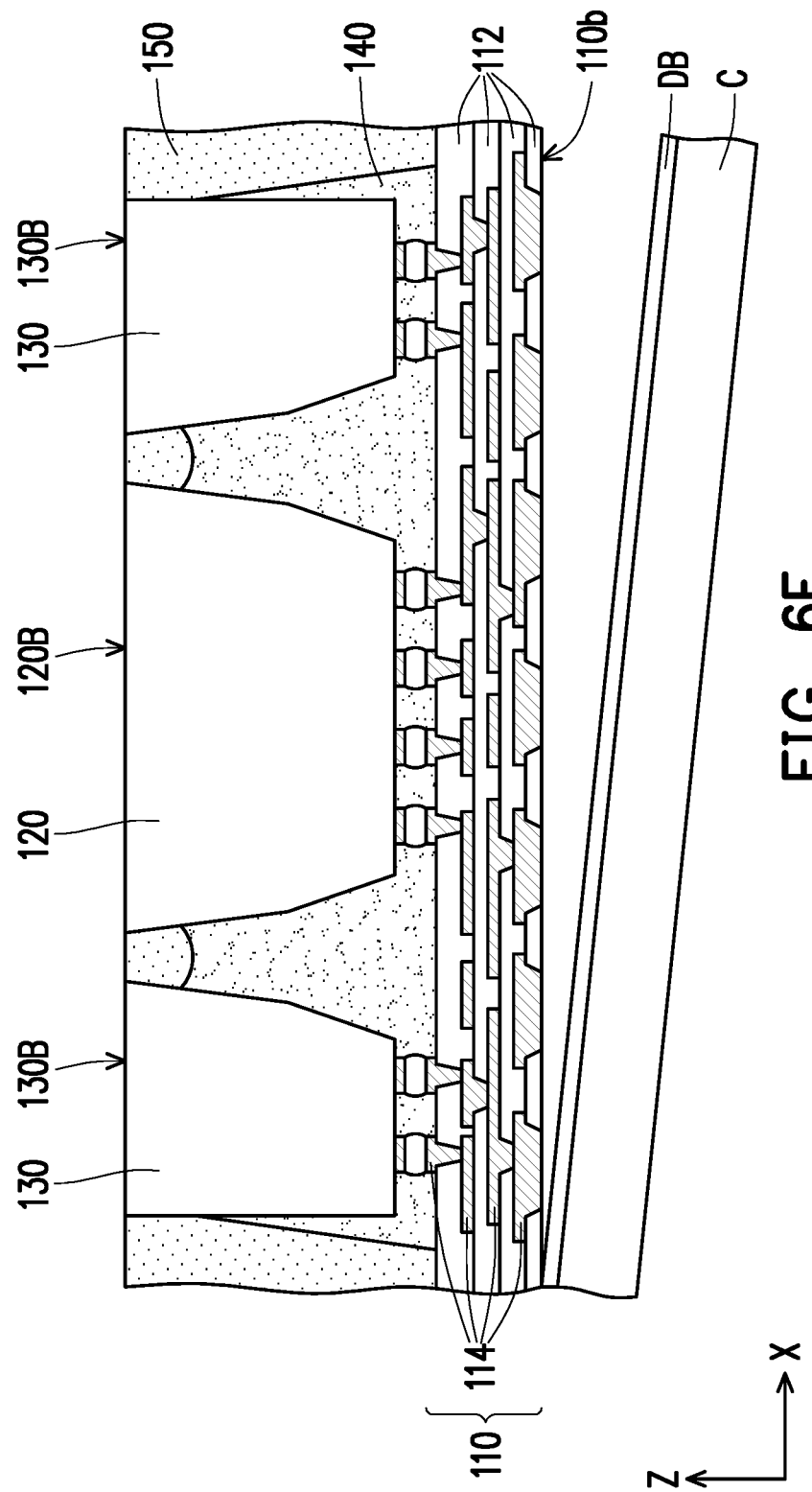

Referring to FIG. 6D and FIG. 6E, the encapsulant 150 is planarized until the back surface 120B of the semiconductor device 120 and the back surfaces 130B of the semiconductor devices 130 are exposed. In some embodiments, as shown in FIG. 6E, after the planarization process, the illustrated top surface of the encapsulant 150 is substantially coplanar with the back surface 120B of the semiconductor device 120 and the back surfaces 130B of the semiconductor devices 130. The encapsulant 150 may be planarized through a grinding process or a chemical mechanical polishing (CMP) process, for example. After the planarization or the grinding process, a cleaning step may be optionally performed to remove the residues generated. However, the disclosure is not limited thereto and the planarization process may be performed through any other suitable method.

After the encapsulant 150 is planarized to reveal the semiconductor device 120 and the semiconductor devices 130, the redistribution structure 110 is separated from the carrier C such that the second surface 110b of the redistribution structure 110 is exposed. In detail, as shown in FIG. 6E, the bottommost layer of the conductive layers 114 for connecting with the later-formed electrical terminals 160 is exposed. In some embodiments, the de-bonding layer DB is a LTHC release layer. Upon irradiation with an UV laser, the de-bonding layer DB and the carrier C may be peeled off and removed from the overlying structure. It should be noted that the de-bonding process is not limited thereto. Other suitable methods may be used in some alternative embodiments. In some embodiments, before the carrier C is removed, a frame tape (not shown) is attached to the back surface 120B of the semiconductor device 120 and the back surfaces 130B of the semiconductor devices 130.

Figure 6F:
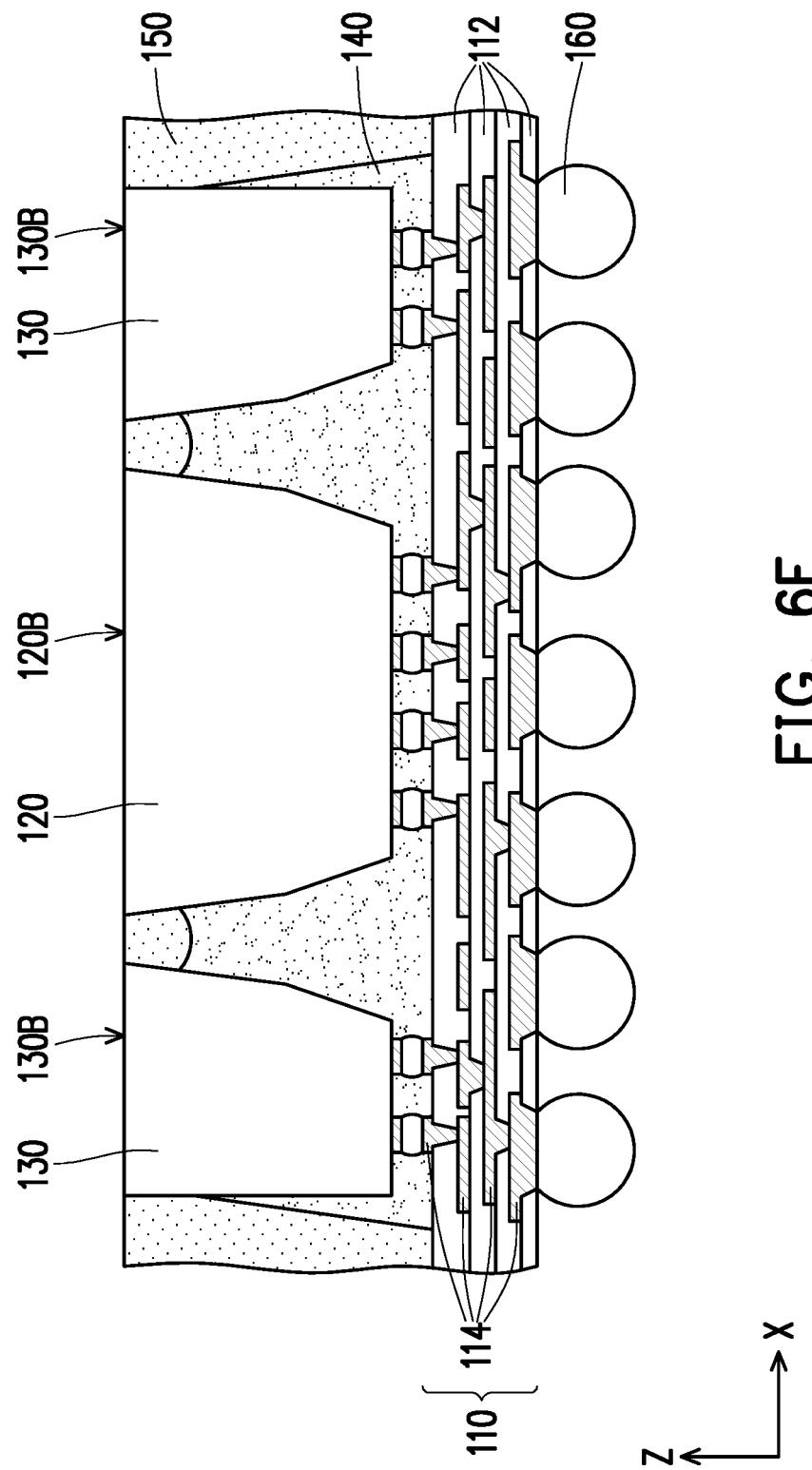

Referring to FIG. 6F, the electrical terminals 160 are formed on and electrically connected with the bottommost layer of the conductive layers 114 of the redistribution structure 110. In some embodiments, the electrical terminals 160 are, for example, controlled collapse chip connection (C4) bumps. The electrical terminals 160 may include a conductive material such as solder, copper, aluminum, gold, nickel, silver, palladium, tin, the like, or a combination thereof. In some embodiments, the electrical terminals 160 are formed by initially forming a layer of solder through evaporation, electroplating, printing, solder transfer, ball placement, or the like. Once the layer of solder has been formed on the structure, a reflow process may be performed in order to shape the material into the desired bump shapes. In another embodiment, the electrical terminals 160 include metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, after the electrical terminals 160 are formed, the frame tape (not shown) remains attached on the back surface 120B of the semiconductor device 120 and the back surfaces 130B of the semiconductor devices 130. However, the disclosure is not limited thereto. In some alternative embodiments, after the electrical terminals 160 are formed, the frame tape (not shown) is separated from the semiconductor device 120 and the semiconductor devices 130.

After the formation of the electrical terminals 160, a singulation process is performed along scribe line regions between the adjacent package regions to cut the whole structure shown in FIG. 6F into a plurality of semiconductor packages 100. As mentioned, the manufacturing process described above is part of a wafer level packaging process, although one singulated semiconductor package 100 is shown in FIG. 1, those skilled in the art should understand that plural semiconductor packages 100 are obtained after the singulation process. In some embodiments, the singulation process is performed to cut through redistribution structure 110 and the encapsulant 150, as shown in FIG. 6F and FIG. 1. The singulation process may be a blade cutting process or a laser cutting process. In some embodiments, the frame tape (not shown) remains attached on the back surface 120B of the semiconductor device 120 and the back surfaces 130B of the semiconductor devices 130 is removed after the singulation process. In a subsequent process, the singulated semiconductor package 100 may, for example, be disposed onto a circuit substrate or onto other components based on requirements.

Although the steps of the method are illustrated and described as a series of acts or events, it will be appreciated that the illustrated ordering of such acts or events are not to be interpreted in a limiting sense. In addition, not all illustrated process or steps are required to implement one or more embodiments of the present disclosure.

In the semiconductor package 100 illustrated in FIG. 1, each of the side surfaces 120S1, 120S3 and 130S1 has two inclined sub-surfaces. However, the disclosure is not limited thereto. In some alternative embodiments, the side surfaces 120S1, 120S3 and 130S1 may respectively have at least two inclined sub-surfaces. Hereinafter, other embodiments will be described with reference to FIG. 10, FIG. 11A and FIG. 11B.

Figure 10:
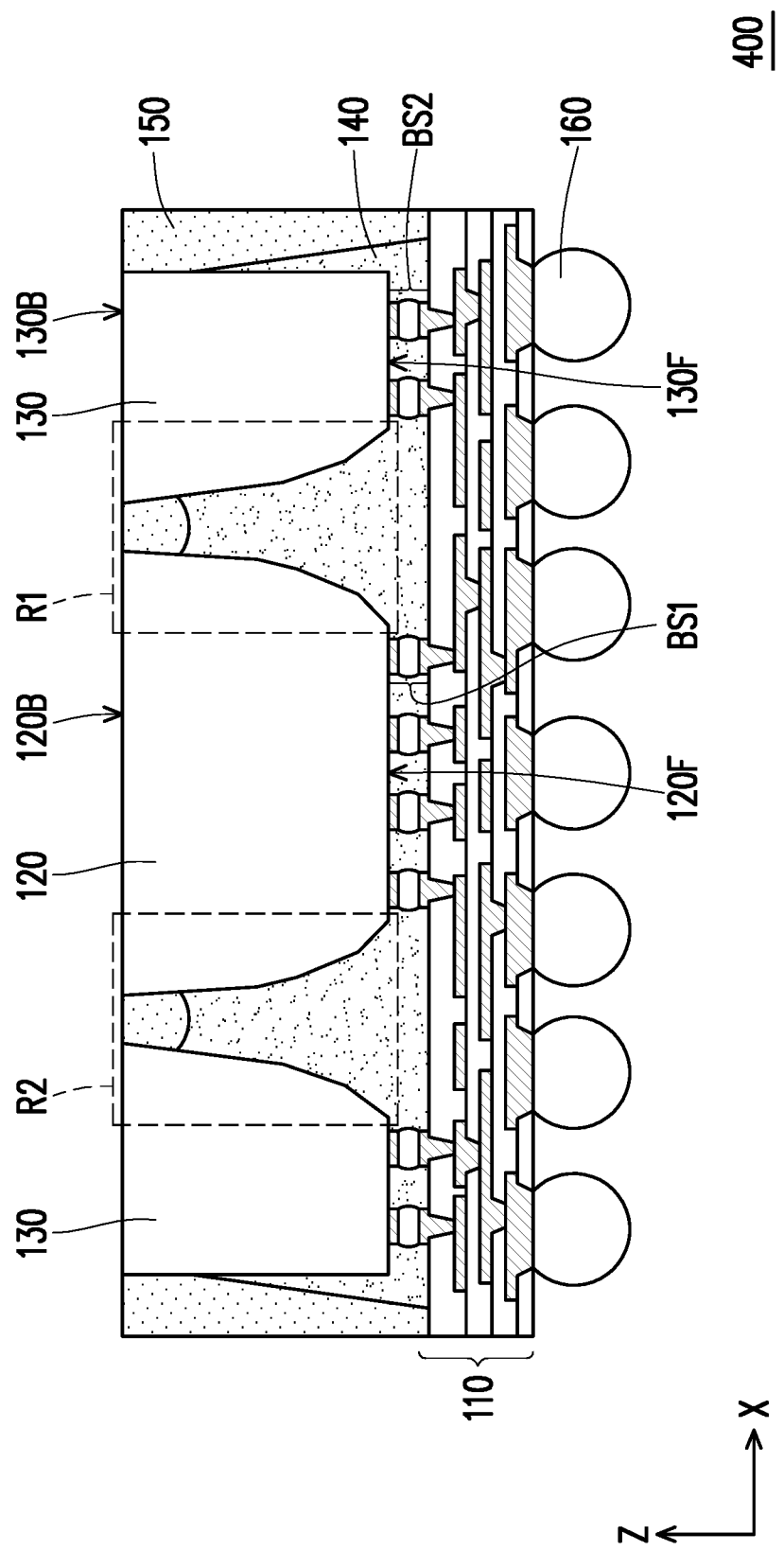
FIG. 10 is a schematic cross-sectional view of a semiconductor package in accordance with some alternative embodiments of the disclosure.
Figure 11B:
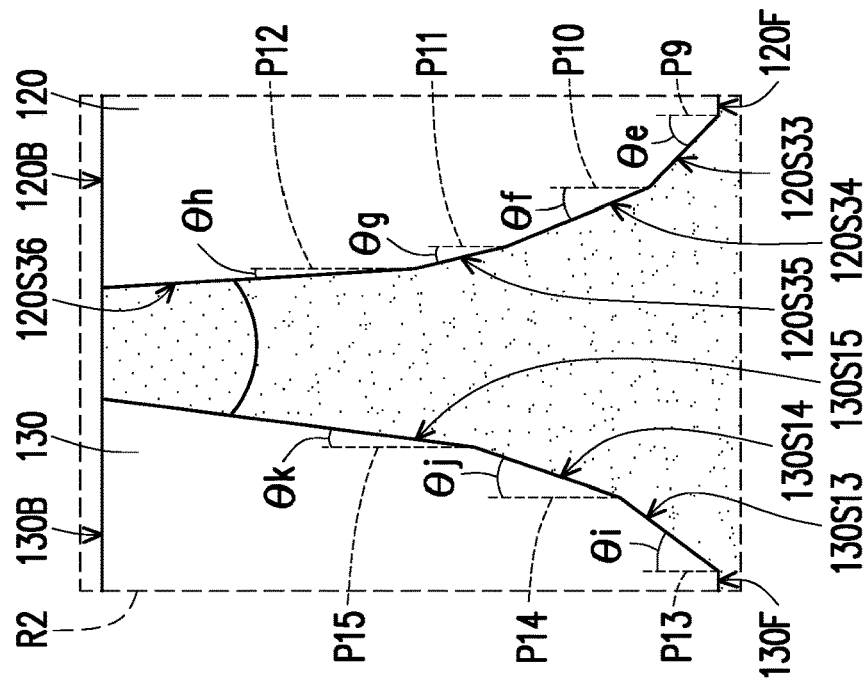
FIG. 11B is a schematic partial enlarge view of the dashed area R2 outlined in FIG. 10.
Figure 11A:
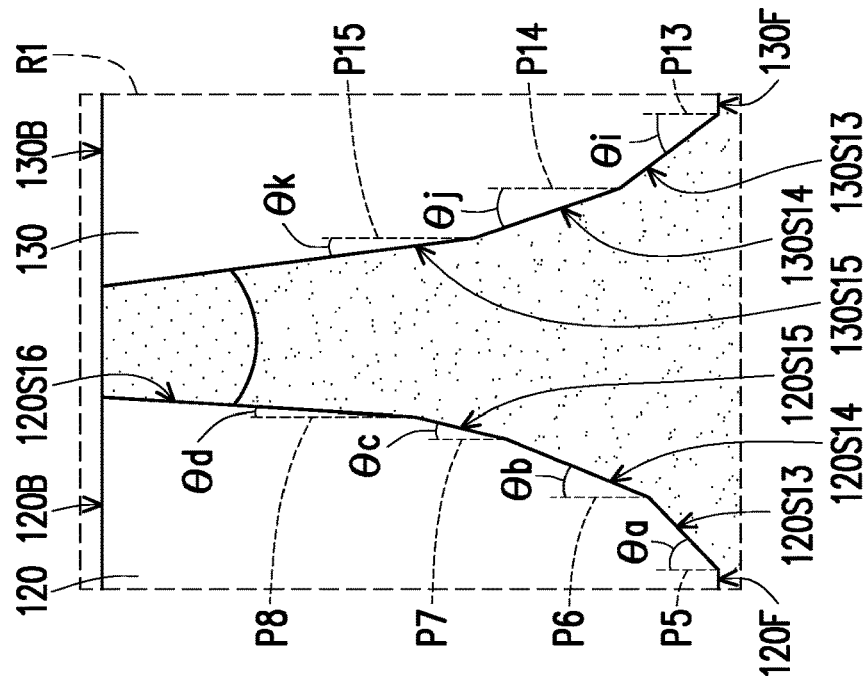
FIG. 11A is a schematic partial enlarge view of the dashed area R1 outlined in FIG. 10.

FIG. 10 is a schematic cross-sectional view of a semiconductor package in accordance with some alternative embodiments of the disclosure. FIG. 11A is a schematic partial enlarge view of the dashed area outlined in FIG. 10. FIG. 11B is a schematic partial enlarge view of the dashed area R2 outlined in FIG. 10. The semiconductor package 400 illustrated in FIG. 10 is similar to the semiconductor package 100 illustrated in FIG. 1, hence the same reference numerals are used to refer to the same or liked parts, and its detailed description will be omitted herein. The differences between the semiconductor package 400 and the semiconductor package 100 will be described below.

Referring to FIG. 10 and FIG. 11A, in the semiconductor package 400, the side surface 120S1 of the semiconductor device 120 includes a sub-surface 120S13, a sub-surface 120S14, a sub-surface 120S15 and a sub-surface 120S16. In detail, as shown in FIG. 10 and FIG. 11A, the sub-surface 120S13 is located between and connected with the front surface 120F and the sub-surface 120S14, the sub-surface 120S14 is located between and connected with the sub-surface 120S13 and the sub-surface 120S15, the sub-surface 120S15 is located between and connected with the sub-surface 120S14 and the sub-surface 120S16, and the sub-surface 120S16 is located between and connected with the sub-surface 120S15 and the back surface 120B. That is to say, in the semiconductor package 400, the side surface 120S1 of the semiconductor device 120 is constituted by four sub-surfaces (i.e., sub-surfaces 120S13, 120S14, 120S15 and 120S16). From another point of view, as shown in FIG. 10 and FIG. 11A, the sub-surface 120S13 connected with the front surface 120F is nearest to the redistribution structure 110, and the sub-surface 120S16 connected with the back surface 120B is farthest away from the redistribution structure 110.

In some embodiments, as shown in FIG. 10 and FIG. 11A, the sub-surfaces 120S13, 120S14, 120S15 and 120S16 are inclined side surfaces. In detail, an included angle θa is between the sub-surface 120S13 and a virtual plane P5 parallel with the direction Z, an included angle θb is between the sub-surface 120S14 and a virtual plane P6 parallel with the direction Z, an included angle θc is between the sub-surface 120S15 and a virtual plane P7 parallel with the direction Z, and an included angle θd between the sub-surface 120S16 and a virtual plane P8 parallel with the direction Z. In some embodiments, as shown in FIG. 10 and FIG. 11A, the included angle θa between the sub-surface 120S13 and the virtual plane P5 is greater than the included angle θb between the sub-surface 120S14 and the virtual plane P6, the included angle θb between the sub-surface 120S14 and the virtual plane P6 is greater than the included angle θc between the sub-surface 120S15 and the virtual plane P7, the included angle θc between the sub-surface 120S15 and the virtual plane P7 is greater than the included angle θd between the sub-surface 120S16 and the virtual plane P8. That is to say, among the included angles θa, θb, θc and θd, the included angle nearer to the redistribution structure 110 is greater than the included angle far away from the redistribution structure 110. In some embodiments, each of the included angles θa, θb, θc and θd is less than 45 degree and greater than 0 degree. From another point of view, the slope of the sub-surface 120S13 connected with the front surface 120F is less than the slope of the sub-surface 120S14 connected with the sub-surface 120S13, the slope of the sub-surface 120S14 connected with the sub-surface 120S13 is less than the slope of the sub-surface 120S15 connected with the sub-surface 120S14, and the slope of the sub-surface 120S15 connected with the sub-surface 120S14 is less than the slope of the sub-surface 120S16 connected with the sub-surface 120S15.

In some embodiments, as shown in FIG. 10 and FIG. 11B, the side surface 120S3 of the semiconductor device 120 includes a sub-surface 120S33, a sub-surface 120S34, a sub-surface 120S35 and a sub-surface 120S36. In detail, as shown in FIG. 10 and FIG. 11B, the sub-surface 120S33 is located between and connected with the front surface 120F and the sub-surface 120S34, the sub-surface 120S34 is located between and connected with the sub-surface 120S33 and the sub-surface 120S35, the sub-surface 120S35 is located between and connected with the sub-surface 120S34 and the sub-surface 120S36, and the sub-surface 120S36 is located between and connected with the sub-surface 120S35 and the back surface 120B. That is to say, in the semiconductor package 400, the side surface 120S3 of the semiconductor device 120 is constituted by four sub-surfaces (i.e., sub-surfaces 120S33, 120S34, 120S35 and 120S36). From another point of view, as shown in FIG. 10 and FIG. 11B, the sub-surface 120S33 connected with the front surface 120F is nearest to the redistribution structure 110, and the sub-surface 120S36 connected with the back surface 120B is farthest away from the redistribution structure 110.

In some embodiments, as shown in FIG. 10 and FIG. 11B, the sub-surfaces 120S33, 120S34, 120S35 and 120S36 are inclined side surfaces. In detail, an included angle θe is between the sub-surface 120S33 and a virtual plane P9 parallel with the direction Z, an included angle θf is between the sub-surface 120S34 and a virtual plane P10 parallel with the direction Z, an included angle θg is between the sub-surface 120S35 and a virtual plane P11 parallel with the direction Z, and an included angle θh between the sub-surface 120S36 and a virtual plane P12 parallel with the direction Z. In some embodiments, as shown in FIG. 10 and FIG. 11B, the included angle θe is between the sub-surface 120S33 and a virtual plane P9 is greater than the included angle θf is between the sub-surface 120S34 and a virtual plane P10, the included angle θf is between the sub-surface 120S34 and a virtual plane P10 is greater than the included angle θg is between the sub-surface 120S35 and a virtual plane P11, the included angle θg is between the sub-surface 120S35 and a virtual plane P11 is greater than the included angle θh between the sub-surface 120S36 and a virtual plane P12. That is to say, among the included angles θe, θf, θg and θh, the included angle nearer to the redistribution structure 110 is greater than the included angle far away from the redistribution structure 110. In some embodiments, each of the included angles θe, θf, θg and θh is less than 45 degree and greater than 0 degree. From another point of view, the slope of the sub-surface 120S33 connected with the front surface 120F is less than the slope of the sub-surface 120S34 connected with the sub-surface 120S33, the slope of the sub-surface 120S34 connected with the sub-surface 120S33 is less than the slope of the sub-surface 120S35 connected with the sub-surface 120S34, and the slope of the sub-surface 120S35 connected with the sub-surface 120S34 is less than the slope of the sub-surface 120S36 connected with the sub-surface 120S35.

In some embodiments, as shown in FIG. 10, FIG. 11A and FIG. 11B, the side surface 130S1 of each semiconductor device 130 includes a sub-surface 130S13, a sub-surface 130S14, and a sub-surface 130S15. In detail, as shown in FIG. 10, FIG. 11A and FIG. 11B, the sub-surface 130S13 is located between and connected with the front surface 130F and the sub-surface 130S14, the sub-surface 130S14 is located between and connected with the sub-surface 130S13 and the sub-surface 130S15, and the sub-surface 130S15 is located between and connected with the sub-surface 130S14 and the back surface 130B. That is to say, in the semiconductor package 400, the side surface 130S1 of each semiconductor device 130 is constituted by three sub-surfaces (i.e., sub-surfaces 130S13, 130S14 and 130S15). From another point of view, as shown in FIG. 10, FIG. 11A and FIG. 11B, the sub-surface 130S13 connected with the front surface 130F is nearest to the redistribution structure 110, and the sub-surface 130S15 connected with the back surface 130B is farthest away from the redistribution structure 110.

In some embodiments, as shown in FIG. 10, FIG. 11A and FIG. 11B, the sub-surfaces 130S13, 130S14 and 130S15 are inclined side surfaces. In detail, an included angle θi is between the sub-surface 130S13 and a virtual plane P13 parallel with the direction Z, an included angle θj is between the sub-surface 130S14 and a virtual plane P14 parallel with the direction Z, and an included angle θk is between the sub-surface 130S15 and a virtual plane P15 parallel with the direction Z. In some embodiments, as shown in FIG. 10, FIG. 11A and FIG. 11B, the included angle θi is between the sub-surface 130S13 and a virtual plane P13 is greater than the included angle θj is between the sub-surface 130S14 and a virtual plane P14, and the included angle θj is between the sub-surface 130S14 and a virtual plane P14 is greater than the included angle θk is between the sub-surface 130S15 and a virtual plane P15. That is to say, among the included angles θi, θj and θk, the included angle nearer to the redistribution structure 110 is greater than the included angle far away from the redistribution structure 110. In some embodiments, each of the included angles θi, θj and θk is less than 45 degree and greater than 0 degree. From another point of view, the slope of the sub-surface 130S13 connected with the front surface 130F is less than the slope of the sub-surface 130S14 connected with the sub-surface 130S13, and the slope of the sub-surface 130S14 connected with the sub-surface 130S13 is less than the slope of the sub-surface 130S15 connected with the sub-surface 130S14.

In the semiconductor package 100 illustrated in FIG. 1, each of the sub-surfaces 120S11, 120S12, 120S31, 120S32, 130S11 and 130S12 is a substantially flat or planar surface. However, the disclosure is not limited thereto. In some alternative embodiments, some of the sub-surfaces may be curved surfaces. Hereinafter, other embodiments will be described with reference to FIG. 12.

Figure 12:
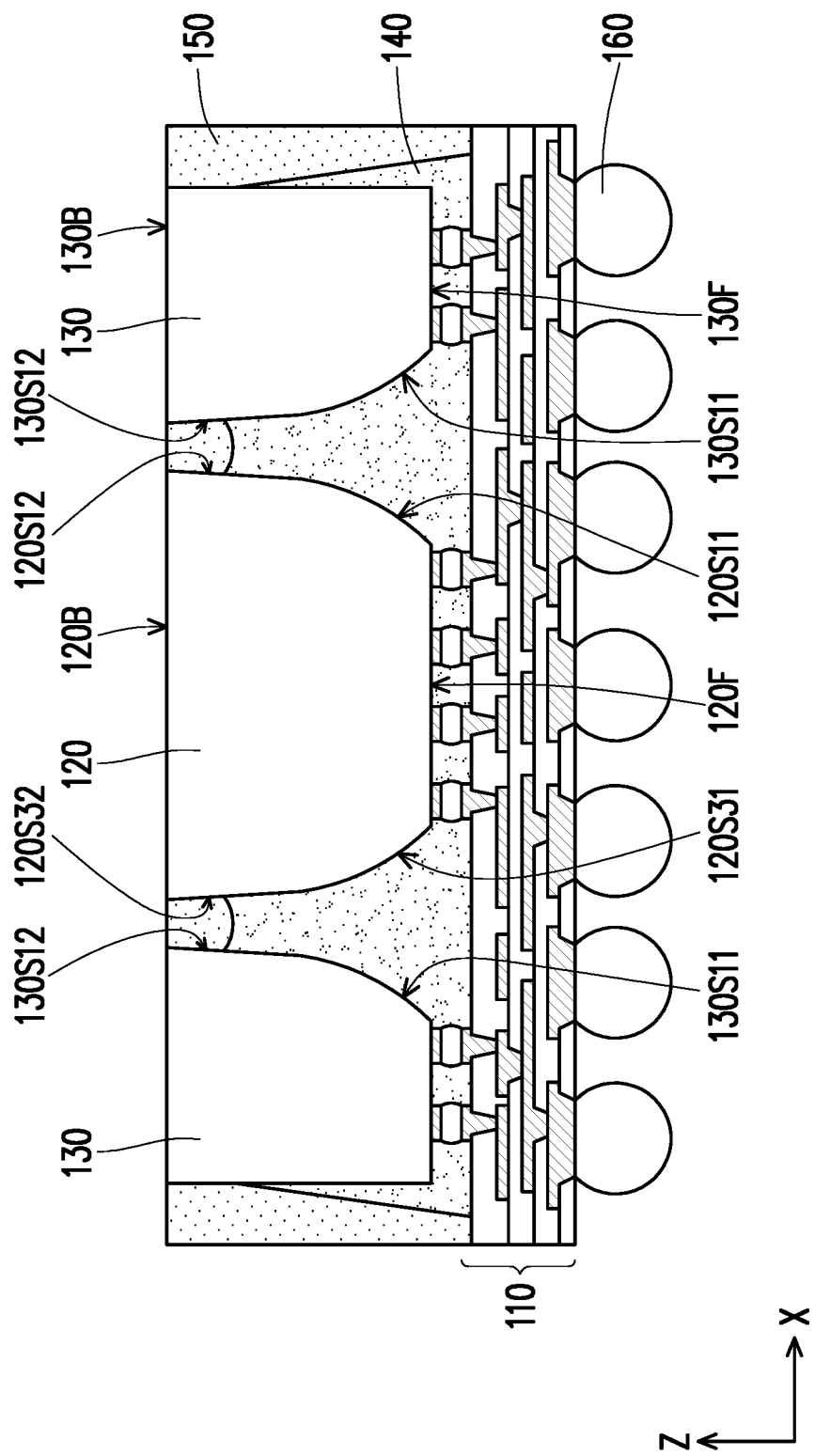
FIG. 12 is a schematic cross-sectional view of a semiconductor package in accordance with some alternative embodiments of the disclosure.

FIG. 12 is a schematic cross-sectional view of a semiconductor package in accordance with some alternative embodiments of the disclosure. The semiconductor package 500 illustrated in FIG. 12 is similar to the semiconductor package 100 illustrated in FIG. 1, hence the same reference numerals are used to refer to the same or liked parts, and its detailed description will be omitted herein. The differences between the semiconductor package 500 and the semiconductor package 100 lies in that the sub-surface 120S11 of the side surface 120S1, the sub-surface 120S31 of the side surface 120S3 and the sub-surface 130S11 of the side surface 130S1 are curved surfaces. For example, when the number of the sub-surfaces connected between the sub-surface 120S12 and the front surface 120F is infinite, the sub-surfaces connecting the sub-surface 120S12 and the front surface 120F may be collectively referred to as the sub-surface 120S11, in which the sub-surface 120S11 exhibits a curved contour. Similarly, in some embodiments, when the number of the sub-surfaces connected between the sub-surface 120S32 and the front surface 120F is infinite, the sub-surfaces connecting the sub-surface 120S32 and the front surface 120F may be collectively referred to as the curved sub-surface 120S31. Also, in some embodiments, when the number of the sub-surfaces connected between the sub-surface 130S12 and the front surface 130F is infinite, the sub-surfaces connecting the sub-surface 130S12 and the front surface 130F may be collectively referred to as the curved sub-surface 130S11.

Figure 13:
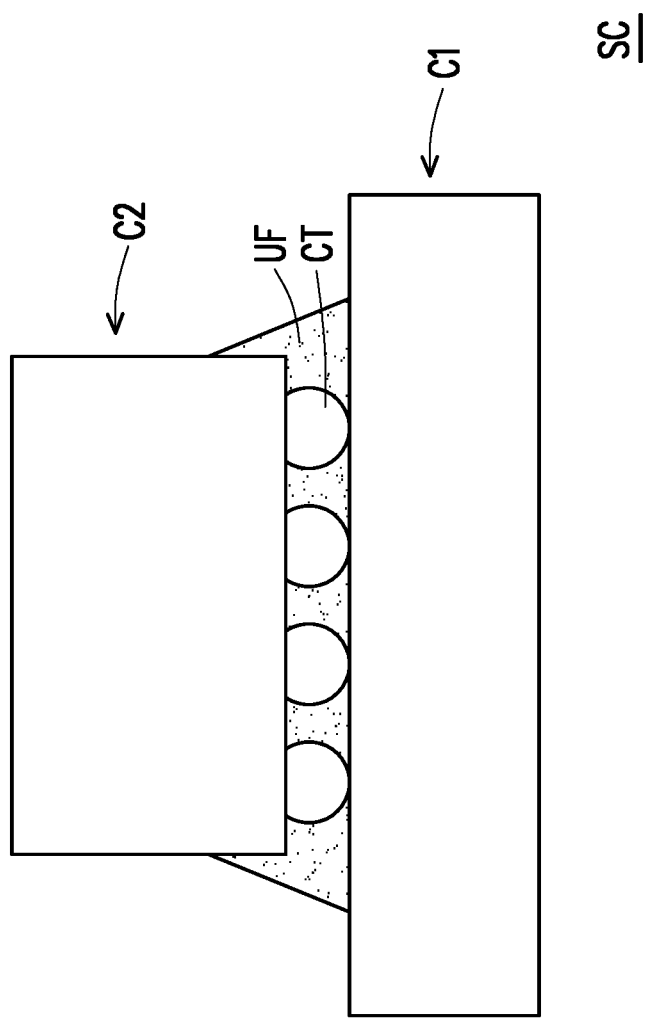
FIG. 13 is a schematic cross-sectional view showing an application of a semiconductor structure in accordance with some embodiments of the disclosure.

FIG. 13 is a schematic cross-sectional view showing an application of a semiconductor structure in accordance with some embodiments of the disclosure. Referring to FIG. 13, a component assembly SC including a first component C1 and a second component C2 disposed over the first component C1 is provided. The first component C1 may be or may include a package substrate, a printed circuit board (PCB), a printed wiring board, and/or other carrier that is capable of carrying integrated circuits. In some embodiments, the second component C2 mounted on the first component C1 is similar to one of the semiconductor packages 100 to 500 described above. For example, one of the semiconductor packages 100 to 500 may be electrically coupled to the first component C1 through a plurality of terminals CT. The terminals CT may be the electrical terminals 160 described above. In some embodiments, an underfill layer UF is formed between the space of the first component C1 and the second component C2 to at least laterally cover the terminals CT. Alternatively, the underfill layer UF is omitted.

Other packaging techniques may be used to form the component assembly SC, which are not limited in the disclosure. For example, the component assembly SC is formed using a wafer level packaging (WLP), a chip-on-wafer-on-substrate (CoWoS) process, a chip-on-chip-on-substrate (CoCoS) process, etc. The component assembly SC may be a part of an electronic system for such as computers (e.g., high-performance computer), computational devices used in conjunction with an artificial intelligence system, wireless communication devices, computer-related peripherals, entertainment devices, etc. The component assembly SC including the semiconductor structure(s) discussed herein may provide high bandwidth data communication. It should be noted that other electronic applications are also possible.

In accordance with an embodiment, a semiconductor package includes a redistribution structure, a first semiconductor device, a second semiconductor, an underfill layer and an encapsulant. The first semiconductor device is disposed on and electrically connected with the redistribution structure, wherein the first semiconductor device has a first bottom surface, a first top surface and a first side surface connecting with the first bottom surface and the first top surface, the first side surface comprises a first sub-surface and a second sub-surface connected with each other, the first sub-surface is connected with the first bottom surface, and a first obtuse angle is between the first sub-surface and the second sub-surface. The second semiconductor device is disposed on and electrically connected with the redistribution structure, wherein the second semiconductor device has a second bottom surface, a second top surface and a second side surface connecting with the second bottom surface and the second top surface, the second side surface faces toward to the first side surface, the second side surface comprises a third sub-surface and a fourth sub-surface connected with each other, the third sub-surface is connected with the second bottom surface, and a second obtuse angle is between the third sub-surface and the fourth sub-surface. The underfill layer is between the first semiconductor device and the second semiconductor device, between the first semiconductor device and the redistribution structure, and between the second semiconductor device and the redistribution structure. The encapsulant encapsulates the first semiconductor device, the second semiconductor device and the underfill layer.

In accordance with an embodiment, a semiconductor package includes a redistribution structure, a first semiconductor device, a second semiconductor device, an underfill layer and an encapsulant. The first semiconductor device is disposed on and electrically connected with the redistribution structure, wherein the first semiconductor device comprises a first portion and a second portion stacking on the first portion along a first direction, the first portion has a first inclined side surface, the second portion has a second inclined side surface connecting with the first inclined side surface, and a slope of the first inclined side surface is less than a slope of the second inclined side surface. The second semiconductor device is disposed aside the first semiconductor device and electrically connected with the redistribution structure, wherein the second semiconductor device comprises a third portion and a fourth portion stacking on the third portion along the first direction, the third portion has a third inclined side surface, the fourth portion has a fourth inclined side surface connecting with the third inclined side surface, a space is between the first semiconductor device and the second semiconductor device and is formed and sandwiched by the first inclined side surface, the second inclined side surface, the third inclined side surface and the fourth inclined side surface, and a slope of the third inclined side surface is less than a slope of the fourth inclined side surface. The underfill layer fills the space between the first semiconductor device and the second semiconductor device. The encapsulant encapsulates the first semiconductor device, the second semiconductor device and the underfill layer.

In accordance with an embodiment, a method of forming a semiconductor package. includes at least the following steps. A first semiconductor device is provided with a first side surface connecting with a first bottom surface and a first top surface, wherein the first side surface comprises a first sub-surface and a second sub-surface connected with each other, the first sub-surface is connected with the first bottom surface, and a first obtuse angle is between the first sub-surface and the second sub-surface. A second semiconductor device is provided with a second side surface connecting with a second bottom surface and a second top surface, wherein the second side surface comprises a third sub-surface and a fourth sub-surface connected with each other, the third sub-surface is connected with the second bottom surface, and a second obtuse angle is between the third sub-surface and the fourth sub-surface. A redistribution structure is formed. The first semiconductor device and the second semiconductor device are bonded to the redistribution structure to have the first side surface facing toward the second side surface. An underfill layer is formed between the first semiconductor device and the second semiconductor device, between the first semiconductor device and the redistribution structure, and between the second semiconductor device and the redistribution structure. The first semiconductor device, the second semiconductor device and the underfill layer are encapsulated by an encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a redistribution structure;
   a first semiconductor device disposed on and electrically connected with the redistribution structure, wherein the first semiconductor device has a first bottom surface, a first top surface and a first side surface connecting with the first bottom surface and the first top surface, the first side surface comprises a first sub-surface and a second sub-surface connected with each other, the first sub-surface is connected with the first bottom surface, the second sub-surface is connected with the first top surface, and a first obtuse angle is between the first sub-surface and the second sub-surface, wherein the first sub-surface and the second sub-surface are inclined surfaces, and a first acute angle is between the first sub-surface and the first bottom surface;
   a second semiconductor device disposed on and electrically connected with the redistribution structure, wherein the second semiconductor device has a second bottom surface, a second top surface and a second side surface connecting with the second bottom surface and the second top surface, the second side surface faces toward to the first side surface, the second side surface comprises a third sub-surface and a fourth sub-surface connected with each other, the third sub-surface is connected with the second bottom surface, the fourth sub-surface is connected with the second top surface, and a second obtuse angle is between the third sub-surface and the fourth sub-surface, wherein the third sub-surface and the fourth sub-surface are inclined surfaces, and a second acute angle is between the third sub-surface and the second bottom surface;
   an underfill layer between the first semiconductor device and the second semiconductor device, between the first semiconductor device and the redistribution structure, and between the second semiconductor device and the redistribution structure; and
   an encapsulant encapsulating the first semiconductor device, the second semiconductor device and the underfill layer.

2. The semiconductor package according to claim 1, wherein a first minimum distance between the first bottom surface and the second bottom surface is greater than a second minimum distance between the first top surface and the second top surface.

3. The semiconductor package according to claim 2, wherein the first minimum distance between the first bottom surface and the second bottom surface is greater than 1.25 times of the second minimum distance between the first top surface and the second top surface.

4. The semiconductor package according to claim 3, wherein the second minimum distance between the first top surface and the second top surface is less than 400 μm.

5. The semiconductor package according to claim 1, wherein
   a first included angle between the first sub-surface and a first virtual plane perpendicular to the first top surface is greater than a second included angle between the second sub-surface and a second virtual plane perpendicular to the first top surface; and
   a third included angle between the third sub-surface and a third virtual plane perpendicular to the second top surface is greater than a fourth included angle between the fourth sub-surface and a fourth virtual plane perpendicular to the second top surface.

6. The semiconductor package according to claim 5, wherein each of the first included angle, the second included angle, the third included angle and the fourth included angle is less than 45 degree and greater than 0 degree.

7. The semiconductor package according to claim 1, wherein the first obtuse angle is the same as the second obtuse angle.

8. The semiconductor package according to claim 1, wherein the first obtuse angle is different from the second obtuse angle.

9. A semiconductor package, comprising:
   a redistribution structure;
   a first semiconductor device disposed on and electrically connected with the redistribution structure, wherein the first semiconductor device comprises a first portion and a second portion stacking on the first portion along a first direction, the first portion has a first inclined side surface, the second portion has a second inclined side surface connecting with the first inclined side surface, a slope of the first inclined side surface is less than a slope of the second inclined side surface, a first surface of the first portion connects with the first inclined side surface and is a top surface of the first semiconductor device, a second surface of the second portion connects with the second inclined side surface and is a bottom surface of the first semiconductor device, and a first acute angle is between the second inclined side surface and the second surface;
   a second semiconductor device disposed aside the first semiconductor device and electrically connected with the redistribution structure, wherein the second semiconductor device comprises a third portion and a fourth portion stacking on the third portion along the first direction, the third portion has a third inclined side surface, the fourth portion has a fourth inclined side surface connecting with the third inclined side surface, a space is between the first semiconductor device and the second semiconductor device and is formed and sandwiched by the first inclined side surface, the second inclined side surface, the third inclined side surface and the fourth inclined side surface, a slope of the third inclined side surface is less than a slope of the fourth inclined side surface, a third surface of the third portion connects with the third inclined side surface and is a top surface of the second semiconductor device, a fourth surface of the fourth portion connects with the fourth inclined side surface and is a bottom surface of the second semiconductor device, and a second acute angle is between the fourth inclined side surface and the fourth surface;
an underfill layer filling the space between the first semiconductor device and the second semiconductor device; and
an encapsulant encapsulating the first semiconductor device, the second semiconductor device and the underfill layer.

10. The semiconductor package according to claim 9, wherein
a first included angle between the first inclined side surface and a first virtual plane parallel with the first direction is greater than a second included angle between the second inclined side surface and a second virtual plane parallel with the first direction; and
a third included angle between the third inclined side surface and a third virtual plane parallel with the first direction is greater than a fourth included angle between the fourth inclined side surface and a fourth virtual plane parallel with the first direction.

11. The semiconductor package according to claim 10, wherein along the first direction, a thickness of the first portion is equal to or greater than a thickness of the second portion, a thickness of the third portion is equal to or greater than a thickness of the fourth portion, and each of the first included angle, the second included angle, the third included angle and the fourth included angle is less than 30 degree and greater than 0 degree.

12. The semiconductor package according to claim 10, wherein along the first direction, a thickness of the first portion is less than a thickness of the second portion, a thickness of the third portion is less than a thickness of the fourth portion, and each of the first included angle, the second included angle, the third included angle and the fourth included angle is less than 45 degree and greater than 0 degree.

13. The semiconductor package according to claim 10, wherein the first included angle is the same as the third included angle, and the second included angle is the same as the fourth included angle.

14. The semiconductor package according to claim 9, wherein the first inclined side surface is separated from the third inclined side surface by a maximum distance along a second direction perpendicular to the first direction, the second inclined side surface is separated from the fourth inclined side surface by a minimum distance along the second direction, the minimum distance is less than 400 μm, and the maximum distance is greater than 1.25 times of the minimum distance.

15. The semiconductor package according to claim 9, further comprising
first bonding structures in contact with the first portion of the first semiconductor device; and
second bonding structures in contact with the third portion of the second semiconductor device.

16. The semiconductor package according to claim 9, further comprising:
electrical terminals disposed on the redistribution structure opposite to the first semiconductor device and the second semiconductor device and electrically connected with the redistribution structure.

17. A method of forming a semiconductor package comprising:
providing a first semiconductor device with a first side surface connecting with a first bottom surface and a first top surface, wherein the first side surface comprises a first sub-surface and a second sub-surface connected with each other, the first sub-surface is connected with the first bottom surface, and a first obtuse angle is between the first sub-surface and the second sub-surface;
providing a second semiconductor device with a second side surface connecting with a second bottom surface and a second top surface, wherein the second side surface comprises a third sub-surface and a fourth sub-surface connected with each other, the third sub-surface is connected with the second bottom surface, and a second obtuse angle is between the third sub-surface and the fourth sub-surface;
forming a redistribution structure;
bonding the first semiconductor device and the second semiconductor device to the redistribution structure to have the first side surface facing toward the second side surface;
forming an underfill layer between the first semiconductor device and the second semiconductor device, between the first semiconductor device and the redistribution structure, and between the second semiconductor device and the redistribution structure; and
encapsulating the first semiconductor device, the second semiconductor device and the underfill layer by an encapsulant,
wherein the first side surface of the first semiconductor device is formed by a first blade cutting process with two blades having different taper angles, and the second side surface of the second semiconductor device is formed by a second blade cutting process with two blades having different taper angles.

18. The method of forming the semiconductor package according to claim 17, wherein the first blade cutting process is the same as the second blade cutting process.

19. The method of forming the semiconductor package according to claim 17, wherein the first blade cutting process is different from the second blade cutting process.

20. The semiconductor package according to claim 9, wherein a first obtuse angle is between the first inclined side surface and the first surface, and a second obtuse angle is between the third inclined side surface and the third surface.

* * * * *